(12) United States Patent
Ahmad

(10) Patent No.: US 11,898,578 B1
(45) Date of Patent: *Feb. 13, 2024

(54) HEAT-ACTIVATED MULTIPHASE FLUID-OPERATED PUMP

(71) Applicant: HAMFOP Technologies LLC, Sacramento, CA (US)

(72) Inventor: Mudasir Ahmad, San Jose, CA (US)

(73) Assignee: Hamfop Technologies LLC, Sacramento, CA (US)

( * ) Notice: Subject to any disclaimer, the term of this patent is extended or adjusted under 35 U.S.C. 154(b) by 189 days.

This patent is subject to a terminal disclaimer.

(21) Appl. No.: 17/471,596

(22) Filed: Sep. 10, 2021

Related U.S. Application Data

(60) Provisional application No. 63/076,546, filed on Sep. 10, 2020.

(51) Int. Cl.
   *F04F 1/04*   (2006.01)
   *F04F 1/14*   (2006.01)
   *F04B 19/24*  (2006.01)

(52) U.S. Cl.
   CPC ............... *F04F 1/04* (2013.01); *F04B 19/24* (2013.01); *F04F 1/14* (2013.01)

(58) Field of Classification Search
   CPC .... F04F 1/04; F04F 1/14; F04B 19/24; H05K 7/20309; H05K 7/20327; H05K 7/20818;
   (Continued)

(56) References Cited

U.S. PATENT DOCUMENTS

| 1,781,541 A | 11/1930 | Einstein et al. |
| 2,927,434 A | 3/1960 | MacCracken |

(Continued)

FOREIGN PATENT DOCUMENTS

| CN | 102410187 A1 | 4/2012 |
| DK | WO2013149621 A1 | 10/2013 |

(Continued)

OTHER PUBLICATIONS

CN 102410187A, English translation, 12 pages.
(Continued)

*Primary Examiner* — Bryan M Lettman
(74) *Attorney, Agent, or Firm* — Mark Protsik; Thomas Schneck

(57) ABSTRACT

A heat-activated multiphase fluid-operated pump. A hot chamber receptive of externally applied heat converts a working fluid into vapor. A pressure-control valve allows vaporized working fluid to escape the hot chamber only when a target pressure is exceeded. A liquid-piston chamber receives the vaporized working fluid, which expands adiabatically to displace pumped liquid within the liquid-piston chamber in a pump stage, expelling it through an exit port having a unidirectional check valve. A condenser receives the displaced liquid and allowing it in a suction stage to return to the liquid-piston chamber through another unidirectional check valve. An injector valve coupled between the liquid-piston chamber and the hot chamber facilitates jets of condensed working fluid to replenish the hot chamber in successive brief spurts responsive to periodic pressure pulses in the liquid-piston chamber that temporarily exceed the pressure in the hot chamber.

19 Claims, 15 Drawing Sheets

(58) Field of Classification Search
CPC ... H05K 7/20827; F25B 23/006; F25B 23/00; F25B 9/14; F25B 27/002; F25B 2400/14; F24F 5/0035; F28D 15/025; F28D 15/0266; F24S 10/95; H01M 10/6569; H01M 10/613; H01M 10/625; H01M 10/6557; H02K 9/14; H02K 9/19
See application file for complete search history.

(56) References Cited

U.S. PATENT DOCUMENTS

| | | | |
|---|---|---|---|
| 5,129,788 A | 7/1992 | Okayasu | |
| 6,042,342 A | 3/2000 | Orian | |
| 6,435,274 B1* | 8/2002 | Weislogel | F28D 15/06 165/274 |
| 7,263,848 B2 | 9/2007 | Bhatti | |
| 7,380,584 B2 | 6/2008 | Ippoushi et al. | |
| 7,503,176 B2* | 3/2009 | Yatsuzuka | F01K 9/02 60/659 |
| 7,971,449 B2 | 7/2011 | Peterson et al. | |
| 8,419,378 B2 | 4/2013 | Fenton et al. | |
| 8,820,114 B2 | 9/2014 | Charamko et al. | |
| 9,239,063 B2 | 1/2016 | Fenton et al. | |
| 9,829,253 B2* | 11/2017 | Mishkinis | F28D 15/0266 |
| 9,869,274 B2 | 1/2018 | Fuhrman | |
| 10,041,708 B2 | 8/2018 | Sedlak et al. | |
| 10,436,521 B2* | 10/2019 | Cho | F25B 49/02 |
| 10,605,501 B2 | 3/2020 | Bangheri | |
| 10,712,100 B2 | 7/2020 | Adamson et al. | |
| 10,830,503 B2* | 11/2020 | Kopko | F25B 5/02 |
| 10,914,266 B2 | 2/2021 | Rolandson | |
| 10,962,304 B2 | 3/2021 | Adamson et al. | |
| 11,737,240 B1* | 8/2023 | Ahmad | F04B 19/24 361/700 |
| 2009/0129946 A1 | 5/2009 | Toubia et al. | |
| 2016/0123637 A1* | 5/2016 | Moreno | F25B 39/02 62/516 |

FOREIGN PATENT DOCUMENTS

| | | |
|---|---|---|
| EP | 0251664 B1 | 4/1990 |
| EP | 2927038 A1 | 10/2015 |
| GB | 303065 A1 | 5/1930 |
| GB | 1329567 A1 | 9/1973 |
| GB | 2015654 A1 | 9/1979 |
| GB | WO2005042981 A1 | 5/2005 |
| GB | WO2005121539 A1 | 12/2005 |
| GB | WO2020030933 A1 | 2/2020 |
| KR | 1020120056521 A1 | 6/2012 |
| WO | WO2005035987 A3 | 4/2005 |
| WO | WO2012091816 A3 | 7/2012 |

OTHER PUBLICATIONS

KR 20120056521A, English translation, 12 pages.
Wikipedia: "Absorption refrigerator", https://en.wikipedia.org/w/index.php?title=Absorption_refrigerator&oldid=970309157, Jul. 30, 2020, 5 pages.
Wikipedia: "Check valve", https://en.wikipedia.org/w/index.php?title=Check_valve&oldid=973253068, Aug. 16, 2020, 7 pages.
Wikipedia: "Computer cooling", https://en.wikipedia.org/w/index.php?title=Computer_cooling&oldid=1045406650, Sep. 20, 2021, 23 pages.
Wikipedia: "Einstein refrigerator", https://en.wikipedia.org/w/index.php?title=Einstein_refrigerator&oldid=973585763, Aug. 18, 2020, 3 pages.
Wikipedia: "Heat pipe", https://en.wikipedia.org/w/index.php?title=Heat_pipe&oldid=973161839, Aug. 15, 2020, 15 pages.
Wikipedia: "Immersion cooling", https://en.wikipedia.org/w/index.php"title=Immersion_cooling&oldid=1043510651", Sep. 10, 2021, 8 pages.
Wikipedia: "Injector", https://en.wikipedia.org/w/index.php?title=Injector&oldid=967631660, Jul. 14, 2021, 7 pages.
Wikipedia: "List of refrigerants", https://en.wikipedia.org/w/index.php?title=List_of_refrigerants&oldid=1035339680, Jul. 26, 2021, 17 pages.
Wikipedia: "Loop heat pipe", https://en.wikipedia.org/w/index.php?title=Loop_heat_pipe&oldid=952560728, Apr. 22, 2020, 3 pages.
Wikipedia: "Metal foam", https://en.wikipedia.org/w/index.php?title=Metal_foam&oldid=1044893829, Sep. 17, 2021, 13 pages.
Wikipedia: "Relief valve", https://en.wikipedia.org/w/index.php?title=Relief_valve&oldid=974509246, Aug. 23, 2020, 4 pages.
Wikipedia: "Safety valve", https://en.wikipedia.org/w/index.php?title=Safety_valve&oldid=957512538, May 19, 2020, 11 pages.
Wikipedia: "Thermal management (electronics)", https://en.wikipedia.org/w/index.php?title=Thermal_management_(electronics)&oldid=1038841962, Aug. 15, 2021, 11 pages.
Wikipedia: "Thermosiphon", https://en.wikipedia.org/w/index.php?title=Thermosiphon&oldid=960989907, Jun. 6, 2020, 4 pages.
Printout: "Capillary limit", Advanced Cooling Technologies, https://www.1-act.com/resources/heat-pipe-performance/capillary-limit/, Nov. 20, 2017, 5 pages.
Printout: "IGBT Cold Plates ATS-CP-1002", Advanced Thermal Solutions, Inc., Cold plates data sheet, Apr. 24, 2018, 2 pages.
Printout: "Closed loop liquid cooling for high power electronics", Advanced Thermal Solutions, Inc., Qpedia, vol. 1, issue 9, Oct. 2007, 5 pages.
Printout: "Liquid cooling systems and their components", Qpedia Newsletter, Apr. 2009, 4 pages.
Article: James D. Van de Ven et al., "Liquid piston gas compression", Applied Energy, Jan. 6, 2009, 9 pages.
Printout: "Futuristic engine for the new hybrid cars: free piston linear alternator (FPLA)", Bright Hub Engineering, Oct. 8, 2001, 2 pages.
Printout: "Which pump should you use? D5 or DDC?", https://www.ekwb.com/blog/which-pump-should-you-use-d5-or-ddc/, Nov. 11, 2016, 6 pages.
Article: S. Langdon-Arms et al., "Development of a solar-powered liquid piston Stirling refrigerator", Energy Procedia, 142, 570-575, 9th Int'l Conference, ICAE2017, Aug. 21, 2017, 6 pages.
Article: J.W. Mason et al., "Design and construction of a solar-powered fluidyne test bed", Proceedings of the ASME 2011 Mechanical Engineering Conference, Nov. 11, 2011, 12 pages.
Paper: T.M. Kuzay et al., "Enhanced heat transfer with metal wool filled tubes", Conference-910375-1, DE91 005831, (osti.gov 6329405), Aug. 1990, 32 pages.
Printout: MicroCool, 3000 series coldplates data sheet, www.microcooling.com, Mar. 15, 2016, 2 pages.
Printout: "Liquid cooling vs. air cooling: What you need to know", https://www.pcworld.com/article/2028293/liquid-cooling-vs-traditional-cooling-what-you-need-to-know.html, by David Murphy, Feb. 19, 2013, 2 pages.
Article: G. Dannen, "The Einstein-Szilard Refrigerators", Scientific American, Jan. 1997, 6 pages.
Printout: "Introduction to safety valves", Spirax Sarco, https://www.spiraxsarco.com/learn-about-steam/safety-valves/safety-valves, Sep. 1, 2020, 29 pages.
Printout: "Heat conducting 3D printing plastics", TCPoly, High performance plastic cold plates datasheet, www.tcpoly.com/products/coldplates, Sep. 10, 2019, 2 pages.
Article: James D. Van de Ven et al., "Developments towards a liquid piston Stirling Engine", American Institute of Aeronautics and Astronautics, Tracking# 132055, Paper #5635, Jun. 20, 2008, 9 pages.
Article: A.H. Zamanian et al., "Identification and compensation of cogging and friction forces in tubular permanent magnet linear motors", Proceedings of the ASME 2017 Dynamic Systems and Control Conference, Oct. 11, 2017, 8 pages.
Article: B. Zohuri, "Basic principles of heat pipes and history", Heat Pipe Design and Technology, DOI 10.1007/978-3-319-29841-2_1, Apr. 2016, 41 pages.

(56) References Cited

OTHER PUBLICATIONS

Article: Jinwang Li et al., "Experimental study on evaporation-capillary pumping flow in capillary wick and working fluid system", Thermal Science, Jan. 2019, 12 pages.

* cited by examiner

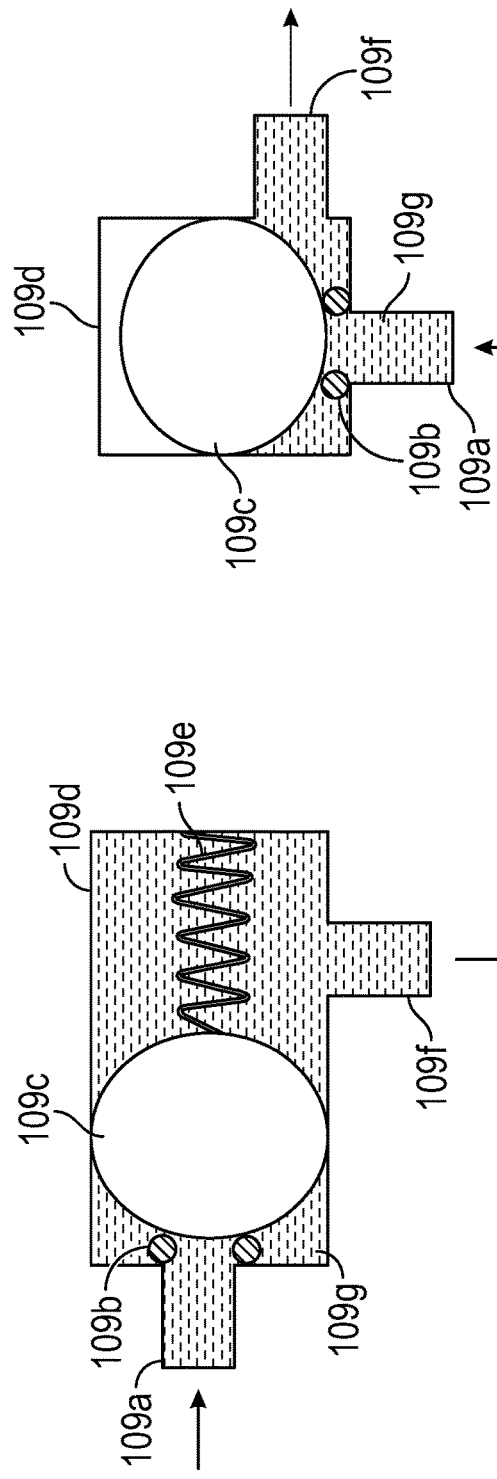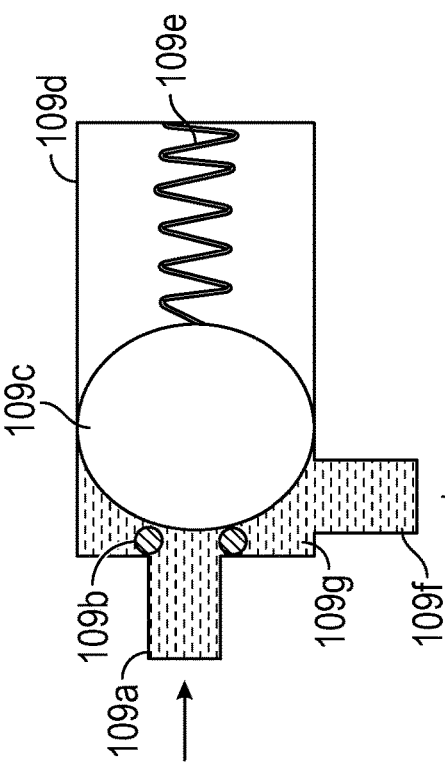

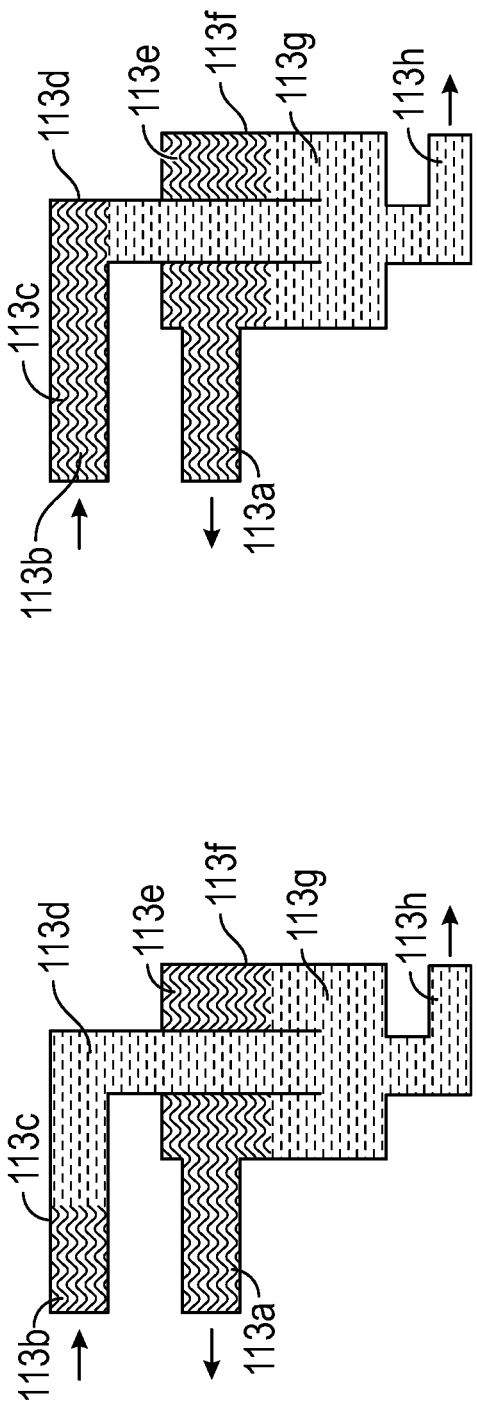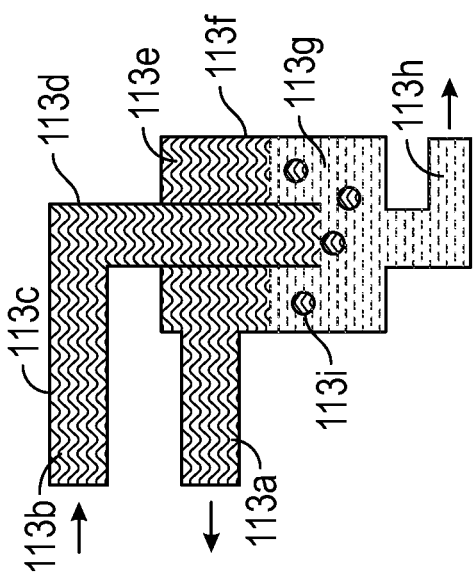
FIG. 10A
FIG. 10B
FIG. 10C

HEAT-ACTIVATED MULTIPHASE FLUID-OPERATED PUMP

CROSS-REFERENCE TO RELATED APPLICATION

The present application claims priority under U.S.C. 119(e) from U.S. Provisional Application 63/076,546, filed Sep. 10, 2020.

TECHNICAL FIELD

The present invention relates to fluid pumping devices and apparatuses for moving fluid from one position to another by converting heat energy into useful work. More specifically, the invention relates to a device that is capable of effectively moving fluid from one position to another and recirculating it as needed, by utilizing heat energy as an input. The invention also relates to the application of such fluid pumping devices to the transport of heat, and especially for the removal of waste heat from locations where it is unwanted.

BACKGROUND ART

The need for fluid pumping is a common and well-established problem dating back centuries. Over the years, advanced pumps have been developed, that run quite efficiently on electricity. The electricity required to run these devices can be obtained from various sources: coal-powered electrical utility generators, solar-power-driven photo-voltaic cells, gasoline or diesel generators, etc. Electrical pumps have virtually dominated the need for other types of pumps due to their superior efficiency.

However, there are situations in which pumping is required but the cost, infrastructure, or reliability requirements cannot be met by commercially available electrical pumps. Specifically, in situations where waste heat is readily available, it could potentially be utilized to pump fluid without requiring expensive and complex albeit more efficient but power-hungry electrical pumps. Such applications include but are not limited to: (1) well water pumping in tropical rural areas without electricity; (2) residential, commercial, or agricultural heating and cooling applications, (3) automotive applications, (4) waste heat recapture of electronics devices, (5) batteries, motors and (6) cooling and waste heat capture applications in wearable devices (like smart watches, fitness monitors etc.).

A non-exhaustive summary of different pump technologies is shown in FIG. 1. The focus of this invention is on mechanical pumps that can utilize heat to perform pumping. Mechanical pumps are comprised of three types: solid piston, diaphragm and fluid driven. Solid piston and diaphragm pumps consume more space, are bulky, prone to fatigue, friction losses and incur high maintenance costs.

Fluid-driven pumps are not as efficient but have fewer parts and are thus lower cost and longer lasting. Fluid-driven pumps can be further categorized into 3 distinct types: absorption/adsorption, fluidyne and multiphase vapor driven. Absorption and adsorption pumps rely on the diffusion of one fluid into another fluid or solid respectively. They are generally quite bulky and require at least 2 or 3 fluids; those fluids are generally expensive. Examples include ammonia, brine, metal hydride, zeolite etc. Fluidyne pumps are based on the Stirling cycle and are thermodynamically efficient. However, there are several challenges with fluidynes, which have limited their adoption: (1) they are not capable of handling variations in pumping loads or heat inputs; (2) they are dependent on a very finely tuned balance between the heating and cooling cycle and the simple harmonic motion of the fluid; (3) the working fluid is usually air, while the liquid acts as the piston (air is a notoriously poor thermal conductor, so while the thermodynamic cycle is very efficient, the mechanical efficiency is much lower due to heat losses); and (4) per watt of output, they are bulkier, heavier and slow. A very tall/large column is needed to pump just a few feet of water for instance.

Multiphase vapor pumps are not as thermodynamically efficient as fluidynes, but they are much more compact because they rely on the latent heat released by a fluid when it changes phase from liquid to vapor. Two common pumps in this class are thermosiphons and heat pipes/loop heat pipes (LHP). Thermosiphons have been used in limited cases to pump water and to cool early internal combustion engines, but since they rely on gravity to return the water for re-heating, their power output is limited, and they are orientation dependent. Heat pipes are more efficient at moving the working fluid and the fluid flow rate is higher than thermosiphons because they rely on capillary flow in a wick (surface tension) to pump the fluid back to the evaporator. However, the flow rate is still so low that they are only used for heat transfer but not for performing additional useful work.

There is a need for a simple, low-cost pump that may not be very efficient but can be miniaturized, easy to install, long lasting and effective at converting heat into useful work.

SUMMARY DISCLOSURE

The present invention comprises a novel heat-activated multiphase fluid-operated pump (HAMFOP) that consists of a set of valves and fluid conducting pipes/channels/chambers interconnected together to convert heat energy into fluid pumping. The pump is comprised of these key elements (shown schematically in FIG. 2):

1. A hot chamber or evaporator 101 that is designed to utilize heat to convert a working fluid into vapor 102. Heat could be applied to it from various sources (e.g., the hot surface of an electrical heater, battery pack, fuel cell stack, silicon, or optical device etc.). A thermal interface material may be placed between the heating device and the heat generating chamber to ensure effective heat transfer. In a preferred embodiment, the heating chamber 101 can be bonded to the heating surface by utilizing various bonding techniques: welding, soldering, gluing or metal-plastic bonding techniques.

2. A pressure control valve 103 that controls the pressure of the working fluid 102 exiting the hot chamber 101. The valve 103 is designed to be nominally/normally closed to ensure that the working fluid 102 only exits the hot chamber 101 at a target pressure. The valve 103 is designed to close after the fluid 102 has exited the hot chamber 101 at a target pressure. The valve 103 is also designed to prevent back pressure from the downstream structures back into the hot chamber 101.

3. A "piston and suction" chamber 104 into which the hot working vapor 102 enters to rapidly push the pumped fluid 114 out of the chamber 104. The chamber 104 is then replenished again with the pumped fluid before the next cycle of pumping. The fluid in this chamber 104 rapidly moves back and forth in each cycle.

4. A unidirectional pressure check valve 109 positioned to allow the pumped fluid 114 to exit the "piston and suction" chamber 104 into a pumping passageway or chamber 108 leading to a condenser 107.
5. A unidirectional pressure check valve 105 positioned to allow suctioned fluid 106 to enter the "piston and suction" chamber 104 from the condenser 107.
6. A unidirectional pressure check return valve 111 positioned to allow some of the pumped fluid 110 to exit the "piston and suction" chamber 104 and return via a replenishment passageway 112 to the hot chamber 101 for re-heating.

BRIEF DESCRIPTION OF THE DRAWINGS

In FIGS. 6C-6E, three embodiments of (optional) electrical energy generation modules are provided to convert some of the useful done by the piston/suction chamber into electrical energy.

FIGS. 7A-7C are side schematic plan views of three different pump-exit check valves for use in either of the HAMFOP embodiments of FIGS. 2 and 3.

FIGS. 10A-10C are side schematic plan views of a working fluid-pumped fluid separator, where the working and pumped fluids are two distinct fluid materials, for use with the alternative HAMFOP embodiment of FIG. 3, wherein FIGS. 10A through 10C show three sequential steps of separator operation.

DETAILED DESCRIPTION

Nomenclature

Working Fluid: The fluid whose change in phase is utilized to performing the pumping operation. The working fluid could be selected from a variety of fluid options: water, as well as commonly used or new refrigerants (e.g., R-130, R-245fa, R-407c, R-410a, R-454b, R-1234yf, etc.). In addition to performance and desired temperature range, safety (flammability and exposure limits) will be factors in the choice of working fluid.

Pumped Fluid: The fluid which needs to be pumped from one location to another. This could be the same as the working fluid or it could be a different fluid altogether. If the pumped fluid is different, it would need to be immiscible with the working fluid.

Ambient Temperature: The temperature in the general environment around the region or device in focus.

The Heat-Activated Multiphase Fluid-Operated Pump

The HAMFOP pump utilizes heat to pump a fluid. The heat is used to convert a working fluid from liquid to vapor. The vapor is then used to displace the fluid that needs to be pumped.

Figure 1:
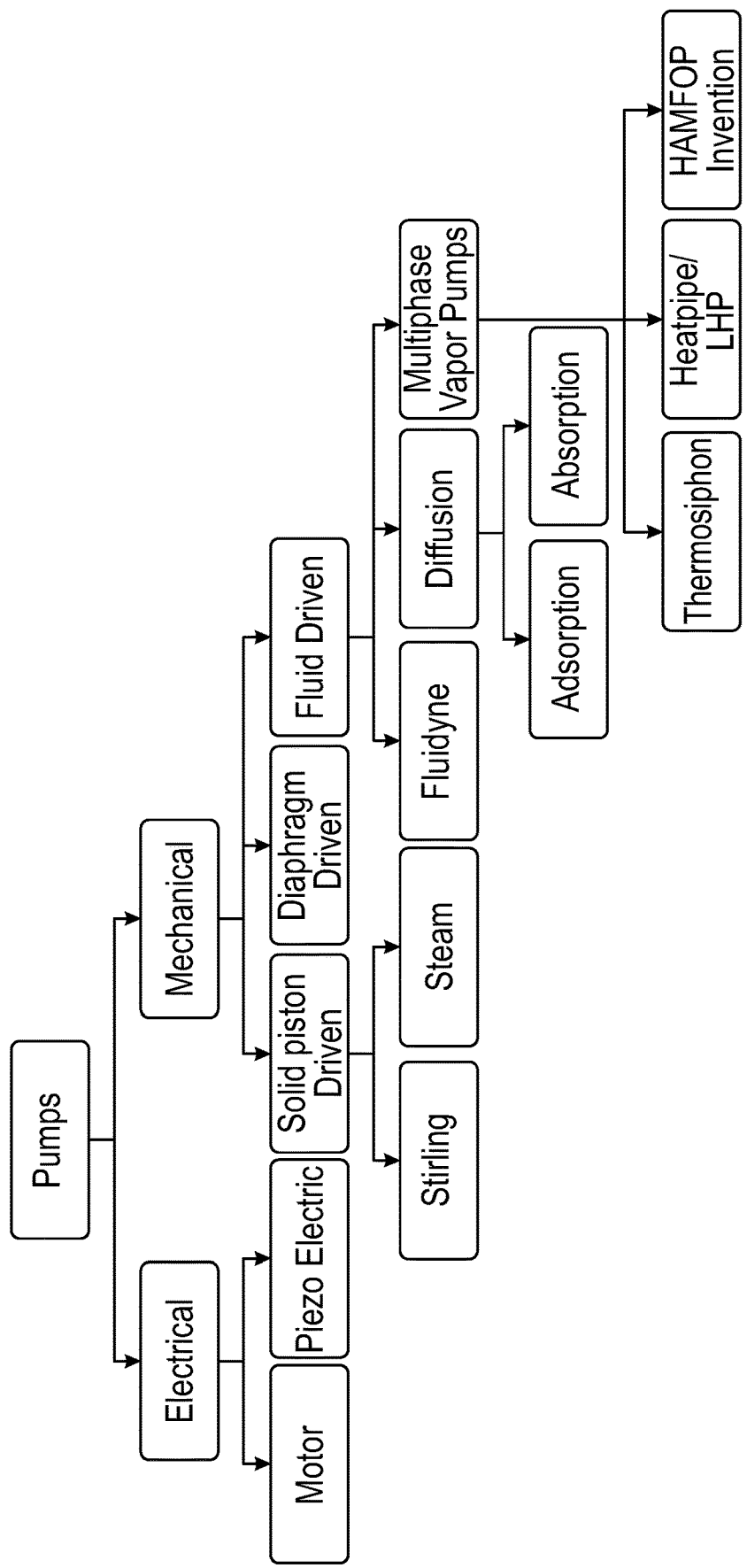
FIG. 1 is schematic block diagram outlining various classes of pump technologies available and their relation to the present invention's HAMFOP technology.
Figure 2:
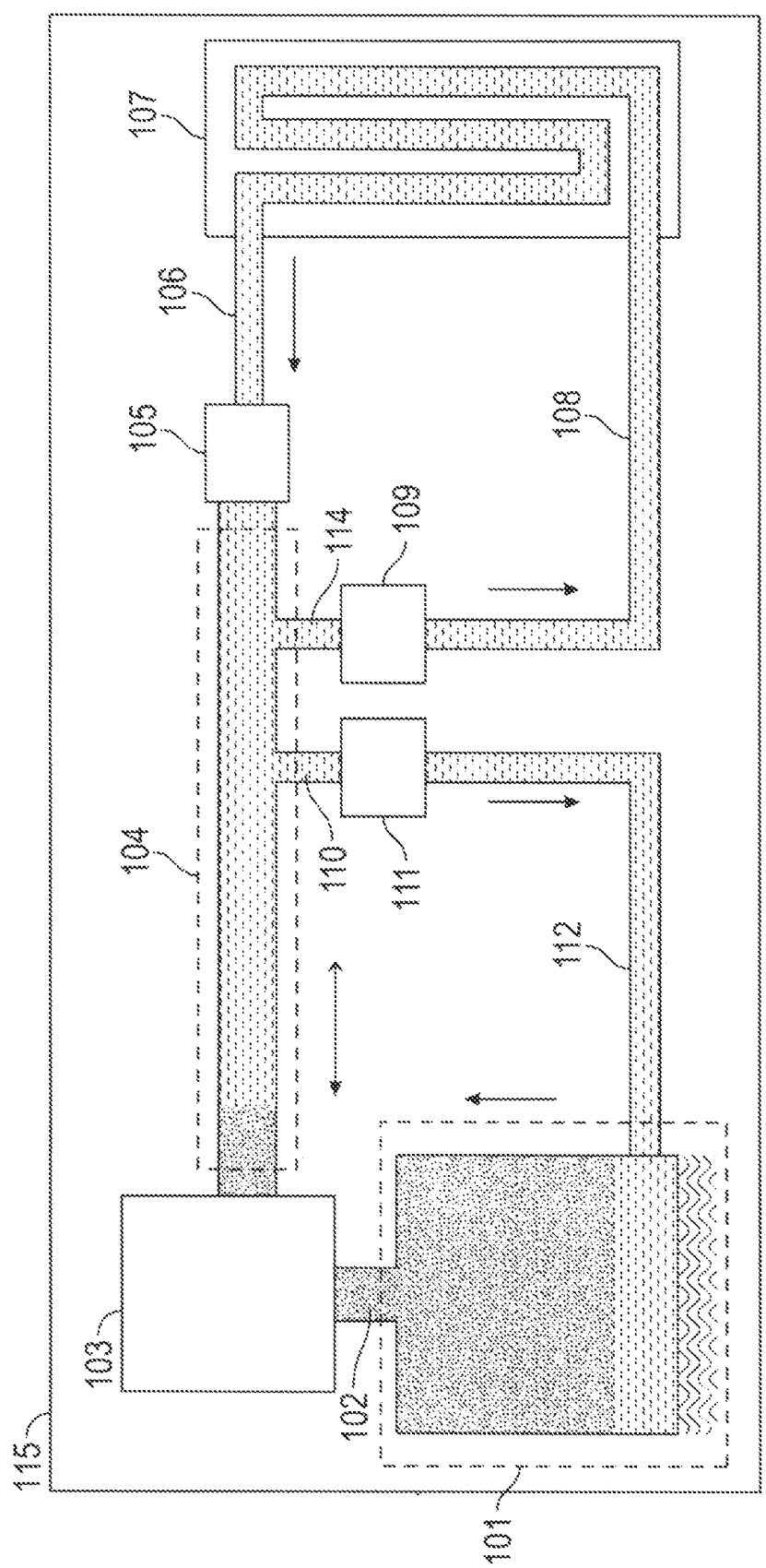
FIG. 2 is a schematic plan view providing an overview of the basic elements of a HAMFOP embodiment in accord with the present invention.

The principle of operation is as follows, as referenced by the numbered elements in FIG. 2, assuming that both the working fluid and the pumped fluid are the same:

1. Heat is applied to the hot chamber or evaporator 101, which contains a small quantity of the working fluid in liquid form. As it is heated, the working fluid is transformed into vapor 102 at a high pressure based on the amount of heat applied and temperature and sizing of the hot chamber 101.
2. The pressurized vapor pushes against the base of the pressure control valve 103, which is counteracted by a deadweight or equivalent load applied on top of it. Once the pressure of the vapor 102 exceeds the deadweight load, the valve 103 opens and the vapor 102 enters a piston/suction chamber 104, which has a larger area. The larger area ensures that the force applied by the vapor 102 remains high enough to keep the valve 103 open until a desired amount of the vapor 102 exits the hot chamber 101. This operation is similar to the principle of operation of a typical safety valve.
3. When the vapor 102 enters the piston/suction chamber 104, which already contains the fluid 114 that needs to be pumped, the high-pressure vapor 102 rapidly expands and displaces the pump fluid 114 from the entry side of the piston chamber 104 towards an exit side (on the right in FIG. 2).
4. The rapid adiabatic expansion of the vapor 102 induces a periodic pressure pulse that flows through the pumped fluid 114 in the piston chamber 104. Since the pumped fluid 114 is incompressible, this temporarily raises the pressure in the piston chamber 104, while the pressure in the hot chamber 101 temporarily decreases due to the loss of the vapor 102. This creates a positive pressure differential between the piston chamber 104 and the hot chamber 101, which results in the opening of a return valve 111. Due to the pressure pulse generated by the rapid entry of the vapor 102 and the incompressibility of the pumped fluid 114, the pressure in the piston chamber 104 transiently rises to a value above the vapor entry pressure. The increased pressure in the piston chamber 104 causes the return valve 111 to open (acting like an injector). Some of the pumped working fluid 110 flows through the return valve 111 and enters via a replenishment passageway 112 back into the hot chamber 101 for re-heating. Once enough working fluid 110 has flowed into the hot chamber 101 to equilibrate the pressure, the return valve 111 closes. This operation is similar to the function that an injector performs in steam engines: high-pressure vapor is used to push a fluid into a high pressure and high temperature evaporator.
5. Since the piston chamber 104 now has slightly less fluid, the working vapor 102 continues to expand adiabatically and push against the pumped fluid 114. As the pressure in the piston chamber 104 continues to remain high, the pump exit valve 109 opens and lets out the fluid 114 via a passageway 108 into the condenser 107. This continues until the fluid 114 has been evacuated from the piston chamber 104 and the pressure in the piston chamber 104 reduces to a pressure close to the pressure in the condenser 107.

6. Upon displacing the pumped fluid 114, the vapor 102 remaining in the piston chamber 104 expands into a larger volume, so it condenses, resulting in a reduction in pressure in the piston chamber 104, to a value below the pressure in the condenser 107. As a result, the pump valve 109 closes, completing the pump portion of the cycle and beginning a suction phase. The suction valve 105 now opens due to the negative differential pressure between the condenser 107 and the piston chamber 104, letting fresh working fluid 106 in. Due to the negative differential pressure, fluid 106 is drawn into the piston chamber 104 from the condenser 107.

7. While the pressure in the piston chamber 104 is below that of the condenser 107, the pressure control valve 103 remains closed to ensure no new vapor 102 enters the piston chamber 104 until the piston chamber pressure returns to above the condenser pressure, concluding the suction phase of the cycle.

8. Once the fluid in the piston chamber 104 has been replenished and the pressure is raised to the pressure of the condenser 107, the pressure control valve 103 re-opens, letting in vapor 102 to repeat the cycle.

9. In some embodiments, an electricity generator module may generate an electrical current induced in winding coils around the piston chamber during the continuous cyclic operation of the pump.

Figure 3:
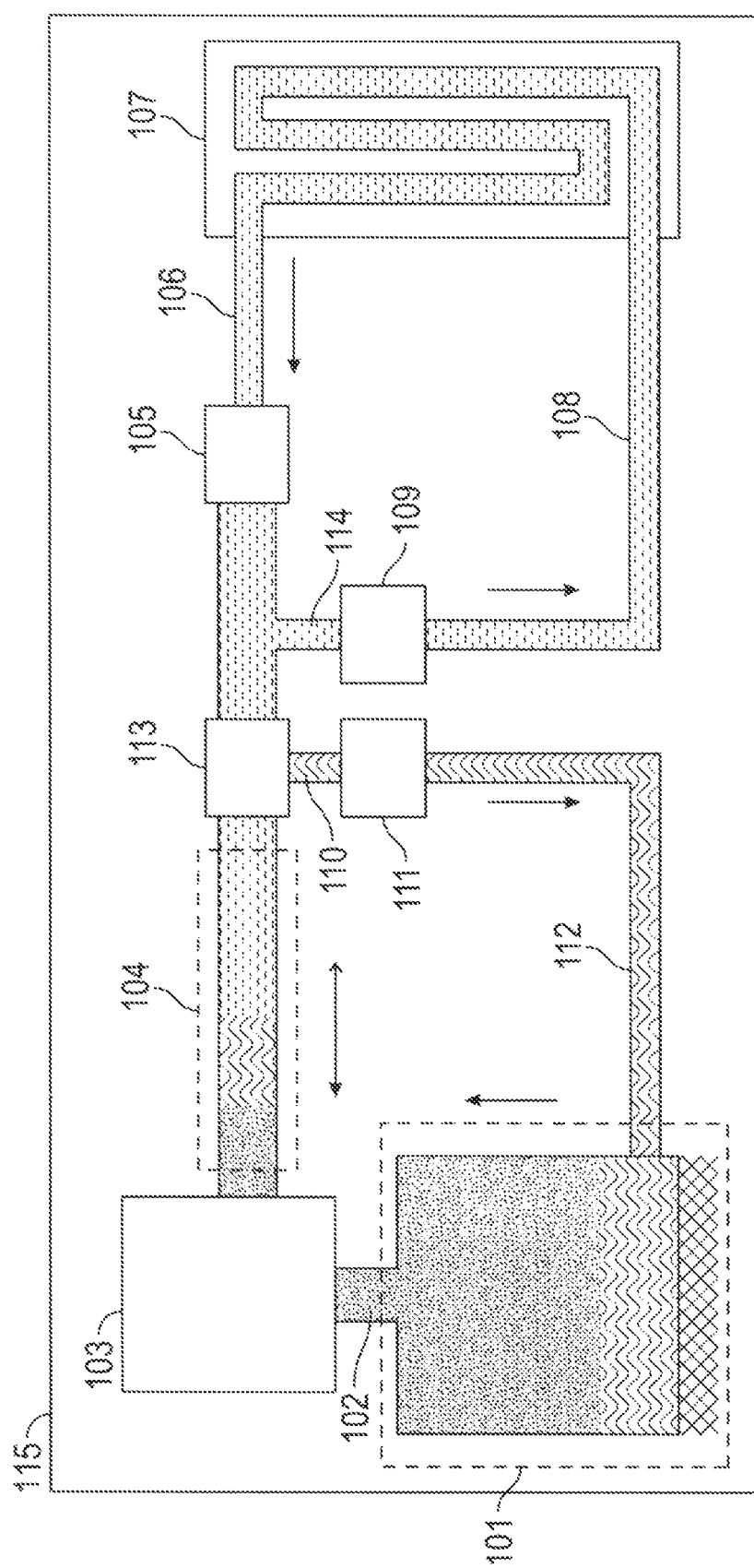
FIG. 3 is a schematic plan of the basic elements of an alternative HAMFOP embodiment in accord with the present invention, wherein two distinct fluid materials are used for the working and pumped fluids.

In the case where the pumped fluid 114 (and 106) is composed of a different material from the working fluid 102 (and 110), and not merely a different liquid-vapor phase of the same material, a difference in density between the working and pumped fluids can be leveraged to separate them. An implementation of this alternative embodiment of the invention is shown in FIG. 3. The elements of this embodiment are largely identical in structure and operation to those in FIG. 2, except for the addition of a separator 113, in which the pumped fluid and the working fluid are separated. The pumped fluid 114 and 106 being of lower density would float to the top while the working fluid 102 and 110 would sink to the bottom. Accurate tuning (balancing the precise quantity of working and pumped fluid) would need to be performed to ensure that the separator chamber 113 never ends up without any working fluid 110 at all. If that were to happen, then some of the pumped fluid 114 could enter the hot chamber 101, thus interrupting the cycle. Each element of the invention is described in detail in the next section.

The hot chamber or evaporator 101 and the condenser 107 can be formed in separate portions of a common plate 115. For example, condenser 107 could comprise a cavity formed by a set of one or more channels in the plate 115, and liquid-piston chamber 104 could also comprise a set of one or more channels in the plate 115.

FIGS. 4-10 show various details of the individual pump elements:

1. Hot Chamber 101

FIGS. 4A-4F show six different embodiments of hot chamber construction. In all six embodiments, common elements (although arranged differently) include a heat source 101a, a working fluid in its liquid phase 101b, the vapor working fluid 101c, a hot chamber body 101d, a vapor exit port 101e, and a working fluid return entry port 101f. Some embodiments include additional elements, such as channel fins 101g, a heating channel 101h, metal foam 101i, and thermal interface material 101j, as described further below.

In applications where the working fluid in vapor form is readily available, a dedicated hot chamber is not required. In applications where heat needs to be used to generate the working fluid in vapor form, the hot chamber is essential. It is a cavity in which the working fluid is converted from liquid 101b to a vapor 101c at high temperature (a vapor generator). The preferred embodiment of the hot chamber is one that has a large surface area to enable easy heat transfer from a heat source 101a through a heated surface 101d to the working fluid 101b, thus transforming the working fluid from liquid to vapor form 101c.

The hot chamber enclosure 101d can be made of any of a variety of materials: copper, aluminum, high-temperature ceramic or other high thermal conductivity material. The portion of the enclosure not exposed to external heat is insulated with insulating materials such as insulating foam, an air cavity or low thermal conductivity plastic or ceramic. The portion of the enclosure exposed to the heat source 101a can be made as thin as possible to reduce thermal resistance. It can also be made of higher thermal conductivity materials than the non-heating walls. The heated surface could be directly exposed to radiant or convective heat, or the heat source 101a could be bonded to the heating surface with a high thermal conductivity thermal interface material 101j.

Inlet and outlet orifices or ports 101f and 101e are created to allow entry of the working fluid in liquid form 101b and exit in vapor form 101c. The orifices could be threaded, welded, soldered, brazed, or otherwise manufactured to ensure a leak-proof fluid ingress and vapor egress. The precise locations of the inlet and outlet orifices can conveniently be selected depending on the desired orientation of the assembly.

Figure 4A:
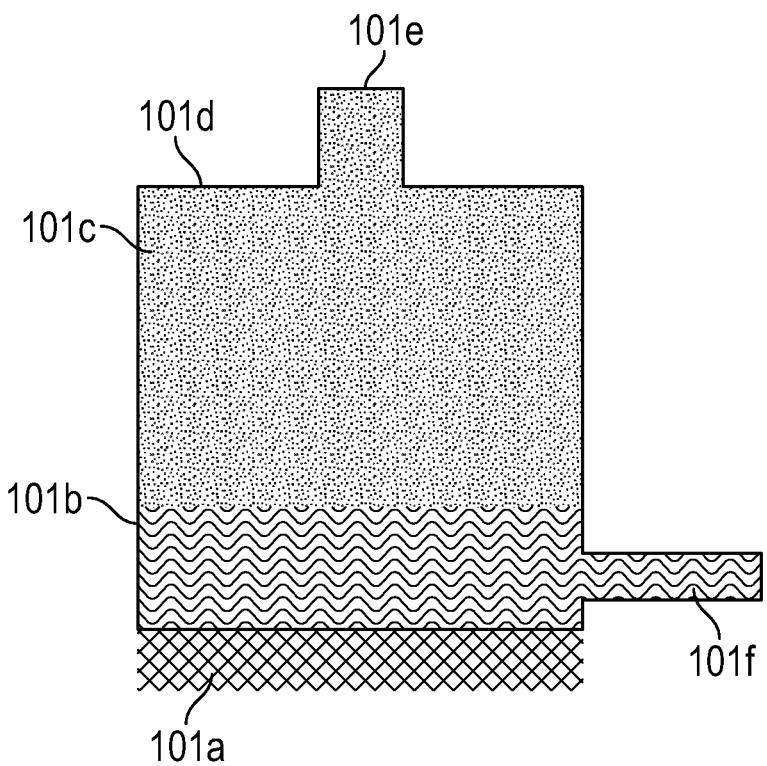
FIGS. 4A-4F are side schematic plan views of six different hot chamber embodiments for use in either of the HAMFOP embodiments of FIGS. 2 and 3.
Figure 4B:
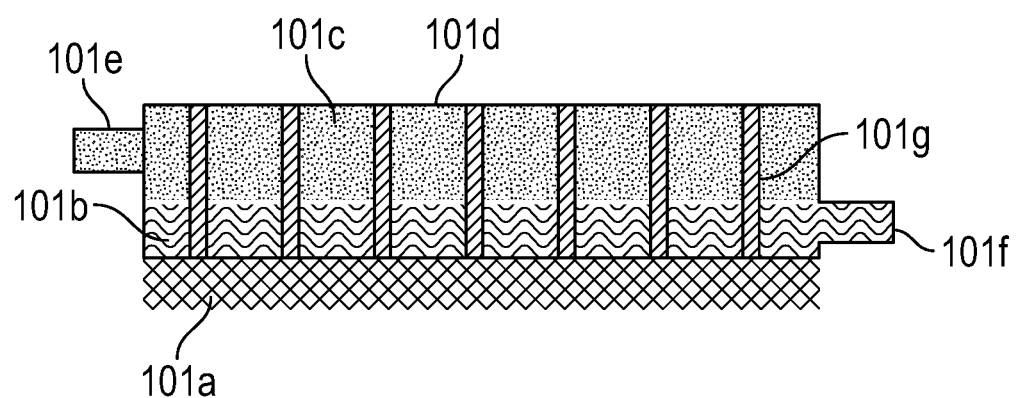
Figure 4C:
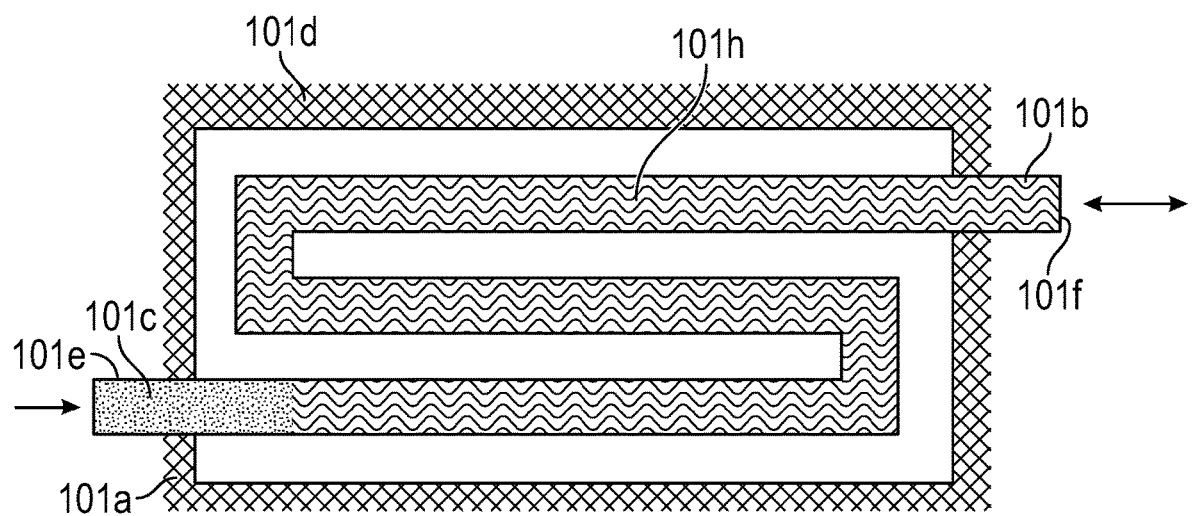
Figure 4D:
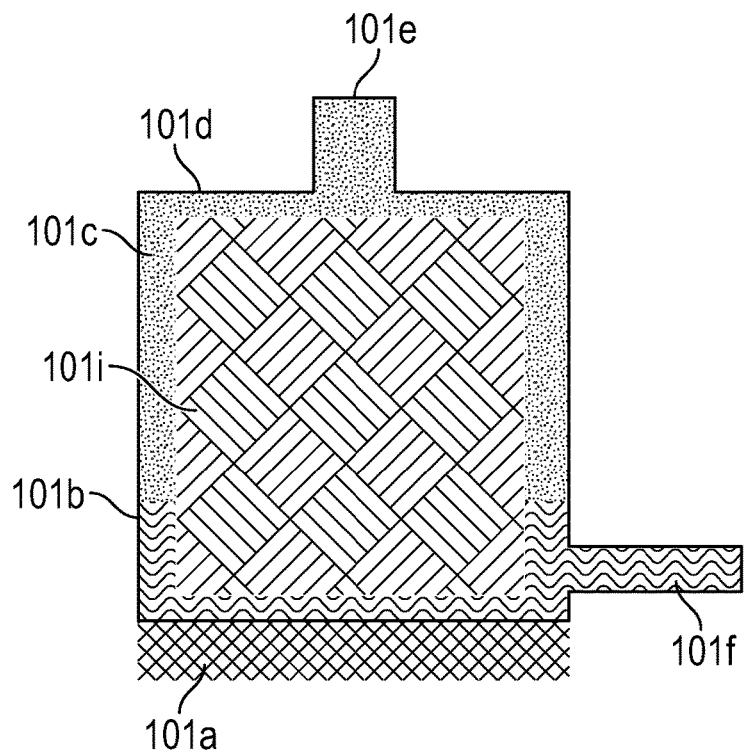
Figure 4E:
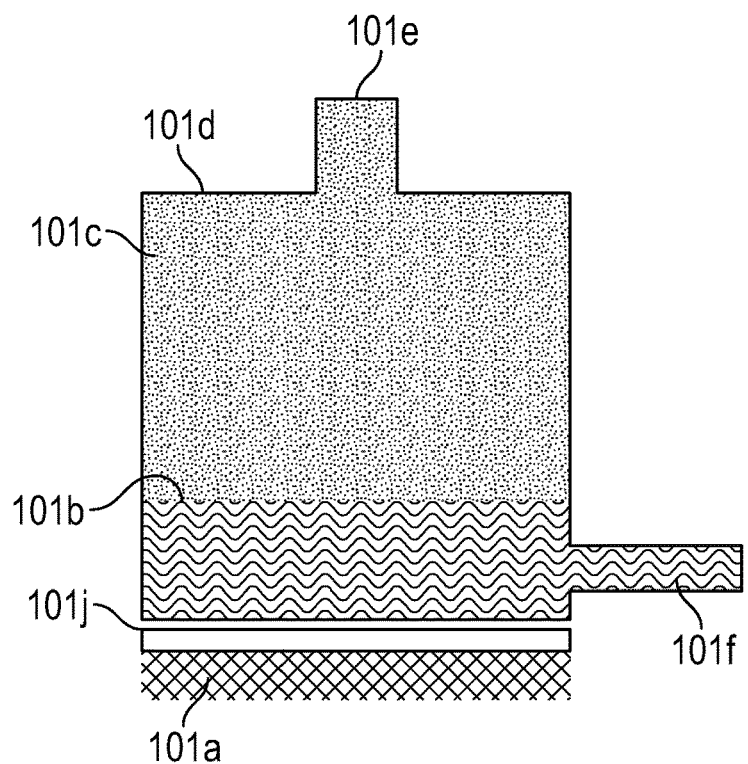
Figure 4F:
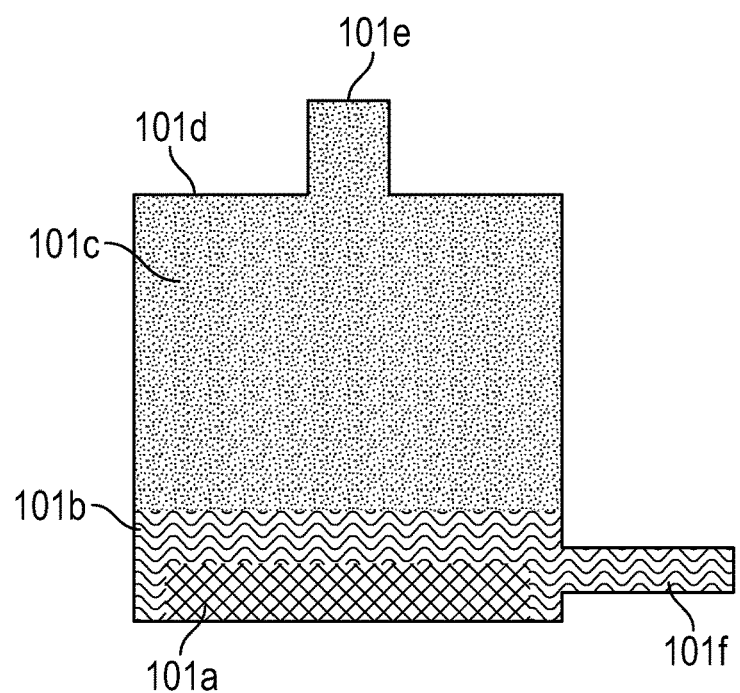

The inner region of the chamber is comprised of structures with large surface area exposed to the working fluid, to maximize the transfer of heat from the external heat source 101a to the working fluid 101b. Various embodiment examples are shown in FIGS. 4A-4F:

a) As seen in FIG. 4A, the simplest embodiment provides conductive heat transfer from the external heat source 101a directly contacting an exterior surface 101d of the hot chamber, the heat passing through the chamber surface to the liquid working fluid 101b to be vaporized 101c. The vapor exit port 101e and liquid return entry port 101f are orifices in the chamber surface 101d.

b) As seen in FIG. 4B, channel fins in the form of fine copper mesh 101g could be bonded (welded, brazed, soldered etc.) into the cavity to allow heat from the enclosure walls to flow into the working fluid 101b.

c) As seen in FIG. 4C, small channels 101h could be created in the enclosure to ensure that the working fluid 101b flows through these channels, thus increasing surface area. The channels 101h, which might be arranged in a serpentine form (as shown) or as multiple parallel passages coupled at each end to the entry to exit ports or in some other geometric form, could be fabricated in a variety of ways such as milling, laser cutting, water jet cutting or small metal plates soldered, brazed or welded closely together.

d) As seen in FIG. 4D, high porosity, high thermal conductivity metal foam 101i could be press-fit into the enclosure 101d. The press fit ensures adequate thermal contact between the enclosure walls 101d and the metal foam 101i for maximum heat transfer. To enhance the heat transfer even further, the metal foam 101i could be bonded to the enclosure walls 101d by utilizing various metal bonding techniques (welding, soldering, brazing etc.). The working fluid would pass within the foam, receiving heat.

e) As seen in FIG. 4E, the heat source 101a is bonded to the heating surface with a high thermal conductivity thermal interface material 101j to facilitate maximum heat transfer across the chamber body 101d where contact is made with the interface material 101j.

f) As seen in FIG. 4F, the heat source 101a may be positioned within the chamber itself so that the heat need not pass through the enclosure walls 101d but be received by the working fluid 101b directly.

The inner walls of the enclosure or the internal structures could be further treated by various techniques to increase surface area even further, such as shot peening, indenting, roughening (to promote nucleate boiling) or coating with specialty materials that can catalyze and hasten boiling.

2. Pressure Control Valve 103

FIGS. 5A-5E show five different embodiments of pressure control valve construction. The pressure control valve performs multiple functions:

(1) It maintains the pressure of the working fluid in the hot chamber at a set pressure. Since many fluids change phase from liquid to vapor at a constant pressure, the pressure control valve could be set at the target peak saturation temperature of the hot chamber.

(2) It ensures that only a predetermined volume of the working vapor would leave the hot chamber. Once the pressure in the hot chamber drops below the target pressure, the valve closes again, preventing the flow of any more vapor out of the hot chamber.

(3) It also ensures that if/when the downstream exhaust pressure drops below a set exhaust pressure, it closes and does not allow vapor to leave the hot chamber until the exhaust pressure rises back to above the set exhaust pressure.

All three functions can be accomplished by using either a solenoid or a manual pressure control valve. The solenoid provides precise, well-controlled, and more efficient control, but can be expensive, requires electricity to be actuated and may not last a very long time. Table 1 shows the pros and cons of both approaches. The appropriate approach can be selected depending on the application.

TABLE 1

Pros and Cons of Pressure Control Approaches

| Pressure Control Approach | Pros | Cons |
|---|---|---|
| Solenoid | 1. Precise and more efficient control<br>2. Can be easily programmed to adapt to changing loading pressure needs | 1. Expensive<br>2. Shorter operating lifespan<br>3. Requires electricity to operate<br>4. May need more space or higher premium miniaturization |
| Manual Valve | 1. Cost Effective<br>2. Longer lifespan<br>3. Easier to maintain | 1. Less precise and less efficient<br>2. Valve's load pressure must be tuned to correspond to the desired saturation temperature of the specific working fluid. |

The manual pressure control valve is comprised of these key elements contained within a valve housing 103f. A biasing mechanism (deadweight or spring 103e, diaphragm 103g, ball 103o, etc.) provides a port-sealing force against an entry orifice 103k that keeps the valve closed except when the working fluid pressure exceeds a specified level:

1. An entry orifice 103k for the vapor 103a to enter the valve. The diameter of this orifice is specifically selected to ensure that vapor at the target pressure enters at a target flow rate.

Figure 5A:
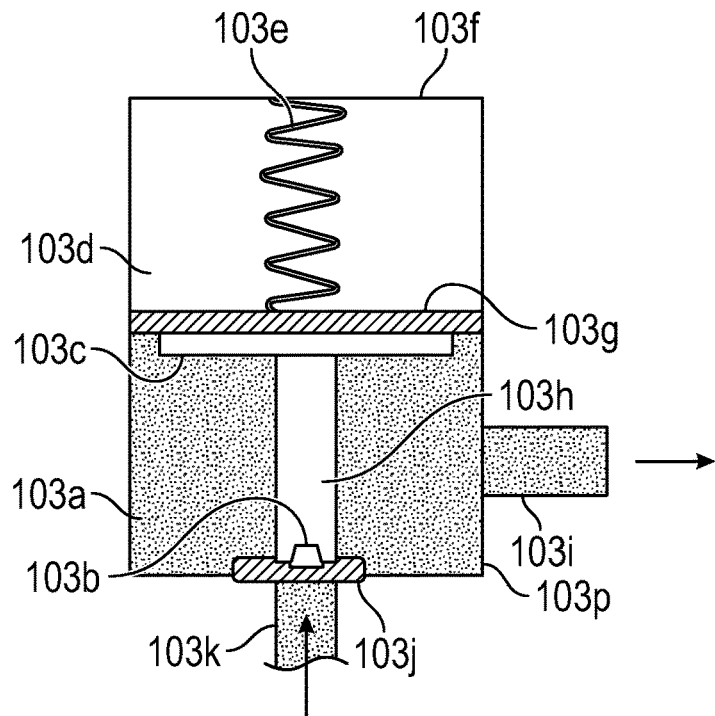
FIGS. 5A-5E are side schematic plan views of five different pressure control valve embodiments for use in either of the HAMFOP embodiments of FIGS. 2 and 3.
Figure 5B:
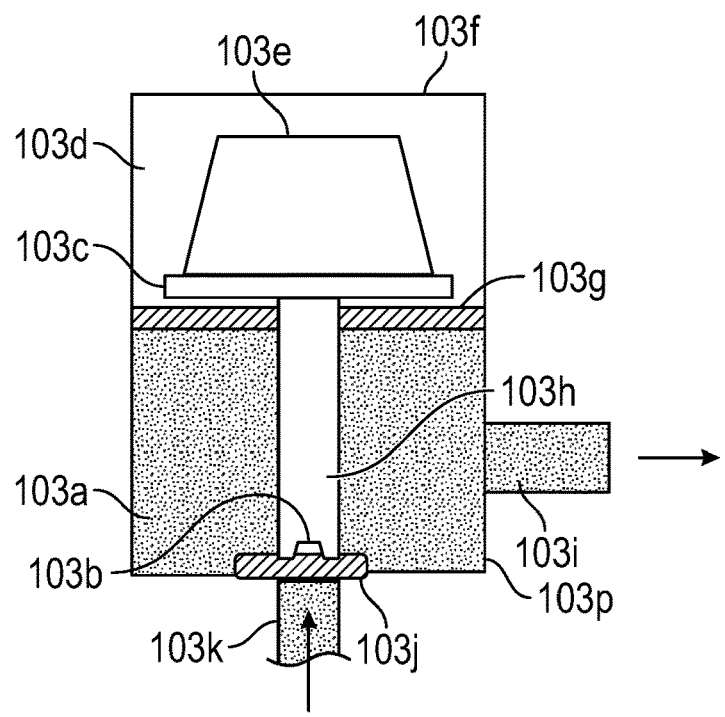
Figure 5C:
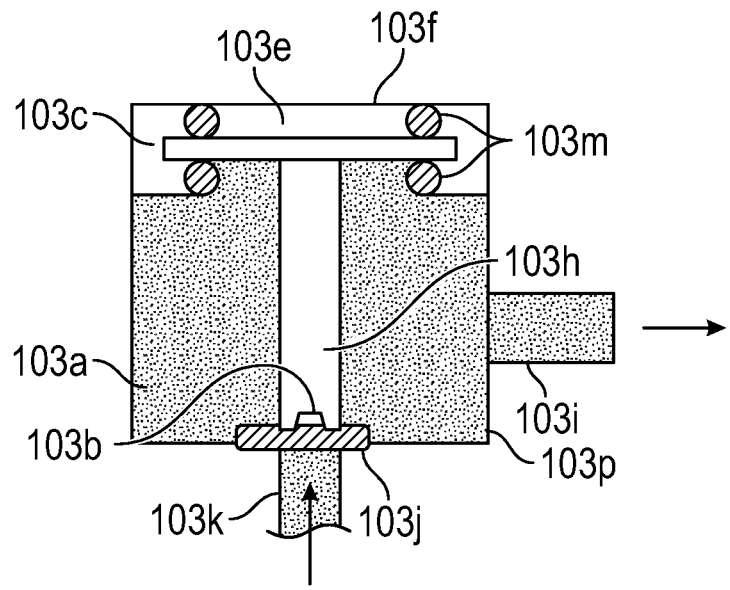
Figure 5D:
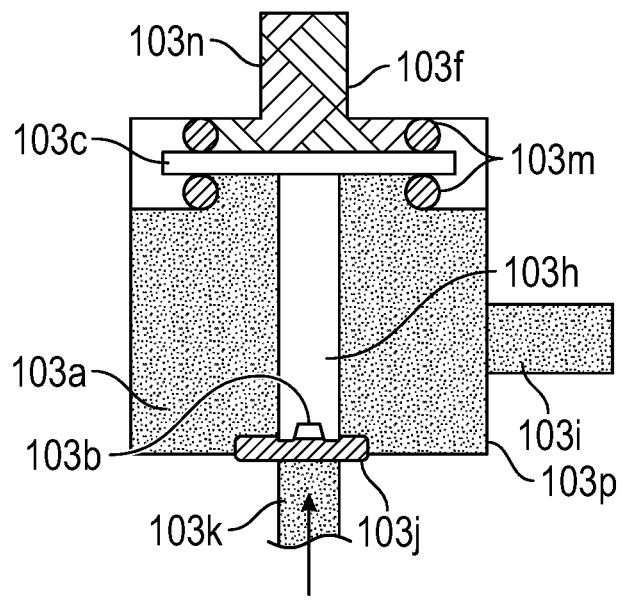
Figure 5E:
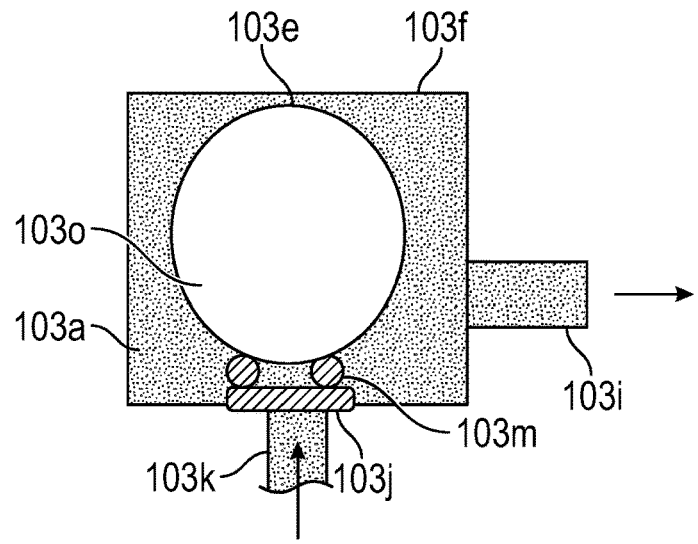

2. A separate cavity 103b larger than the orifice 103k receiving the working fluid 103a and housing a solid pressure sealing element 103j that presses against the orifice 103k to ensure that there is no leak, and the valve remains fully closed when the vapor pressure is below the target pressure. This element could have multiple embodiments:

a) A cylindrical actuator stem structure 103h with a smooth, flat base with a sealing gasket 103j to ensure leak free contact pressure. The cylindrical actuator stem structure 103h could be made of a high thermal conductivity material (e.g., aluminum, copper etc.).

b) A cylindrical structure with a circumferential ring 103m at the base, to form a high contact pressure seal around the orifice, against a soft sealing gasket.

c) For certain space constrained and miniaturized applications (like smartphones, wearables etc.) it could be a cylindrical ball 103o that is compressed against the orifice to maintain a good seal, as seen in FIG. 5E. The ball 103o could be made of rubber, ceramic, tungsten, steel, or other suitable material to ensure good sealing hertzian contact. The gasket 103j could be made of soft polymeric or similar such material to ensure good compression and proper sealing. In another embodiment, the gasket could also be an O-ring 103m designed to maintain a target contact pressure and seal.

3. An encasing structure 103g on top of the cavity 103d, pressed into place to seal the cavity and prevent any fluid leaks.

a) A flexible membrane diaphragm 103g material that deforms within an acceptable range under pressure.

b) A metal sealing structure 103c held in place by contact pressure and sealed with compressed O-rings 103m to prevent leaks but allow slight deformation when the valve is opening and closing.

4. A counterweight structure 103e (as in FIG. 5B) on top of the diaphragm 103g to apply a counter pressure on the cavity 103d. This counterweight 103e can be tuned to establish the precise set pressure to apply to the valve. Aside from the direct acting deadweight, alternative approaches can also be used to counter the vapor pressure: spring-loaded types 103e (as in FIG. 5A), lever-arm dead weights etc. Multiple embodiments of this counterweight structure can be utilized depending on the specific application. Here are some preferred embodiments for different applications:

a) In applications where the overall height of the valve is not a concern, a deadweight 103e of a set value can be used (FIG. 5B). In applications where the overall height of the valve is a concern (such as in computer server applications), a higher density deadweight can be utilized (like Tungsten). This makes the overall height low.

b) In applications where the overall height is even more constrained, the embodiment in FIG. 5D can be used. This utilizes a counterweight liquid 103n, such as gallium or another high-density liquid, which can be poured into the top portion and sealed into place. The height of the liquid column can be tuned to achieve whatever height requirements are acceptable. This utilizes Pascal's law of uniform hydraulic pressure to achieve and maintain a mechanical advantage in a small space. The O-ring 103m around the metal plate 103c is designed to be pre-compressed so it ensures the liquid metal 103n never leaks or mixes with the working fluid 103a. Multiple concentric O-rings could be used to ensure no leaks. The O-rings 103m could also be replaced with metal bellows, flexible pads or even springs to achieve the same goal: allow deflection without any leaks. Moreover, in applications where the counterweight needs to be dynamically changed during operation, a bimetallic strip can be used to automatically raise or lower the height of the liquid column based on the temperature of the working fluid.

c) In applications where the overall height is still such a concern that a liquid column cannot be used (e.g., wearable devices or smartphones etc.), the weight can be removed entirely, and the diaphragm membrane 103c designed to be stiff enough to act as the counterweight (FIG. 5C). The dimensions, thickness, and geometry of the membrane diaphragm 103c can be tuned to achieve the target counter load. In applications where the counterweight needs to be dynamically changed during operation, the membrane 103c can be designed to be temperature sensitive so its stiffness and deflection can change based on the temperature of the working fluid.

5. An exit orifice 103i that allows the vapor to exit the valve. The diameter of this orifice is also designed to ensure that a target vapor flow rate is achieved from the valve exhaust.

The principle of operation of the valve is as follows: (1) the valve remains closed until the hot chamber pressure rises to a target pressure. The target pressure is determined by the area of the inlet orifice 103k, and by the weight of the counterweight 103e (FIG. 5B or 5E) or 103n (FIG. 5C) or the stiffness of the spring 103e (FIG. 5A) or of the actuator surface 103c (FIG. 5D). Once the pressure exceeds the set pressure, the sealing element 103j is lifted by the vapor and the vapor enters the second cavity 103p. Once the vapor enters the second cavity; its pressure drops. To ensure that the valve does not close immediately after opening, the diameter of the second cavity 103p is selected to be larger than the entry orifice 103k. This ensures that the overall upward pressure applied on the counterweight is still high enough to keep the valve open until a desired amount of vapor has exited. This utilizes the principle of mechanical advantage: the larger area of the second cavity ensures that the upward counter pressure applied by the vapor to keep the counterweight lifted is high enough to keep vapor flowing. Once the vapor enters the second cavity 103p, it starts exiting from the exhaust orifice 103i. This continues until the upward counter force in the second cavity drops below the counterweight load. Then the valve closes and does not open again until the hot chamber pressure exceeds the set pressure. The cycle then repeats.

3. Piston/Suction Chamber 104

FIGS. 6A-6E show five different embodiments of piston/suction chamber construction. This chamber 104c is where the pumping and suction action takes place. The principle of operation is as follows: (1) High-pressure vapor 104b exhausted from the pressure control valve enters this chamber 104c through an entry port 104a and quickly displaces the pumping fluid 104g already present in this chamber 104c. This is done very rapidly before the vapor 104b condenses. During this process, the vapor 104b rapidly expands, displacing the incompressible pumping fluid 104g from the chamber 104c. As the fluid 104g is displaced from the chamber 104c, the volume available to the vapor 104b increases and as a result, the vapor condenses. This condensation results in heat being transferred from the vapor 104b to the walls of the chamber 104c and the pumped fluid 104g exiting the chamber 104c through an exit port 104f. (2) As the vapor 104b condenses, the chamber 104c is partially evacuated and as a result, the pressure in the chamber 104c drops significantly. (3) Once the pressure drops below a set threshold, more pumping fluid enters the chamber 104c through a return port 104e to fill it before more vapor is again released. The cycle then repeats.

To ensure efficient operation, the chamber 104c needs to be designed such that most of the heat loss is to the pumped liquid 104g, and the heat in the chamber 104c is retained to warm up the incoming pumped fluid entering through the return port 104e. This may be accomplished by implementing the following design features:

1) The walls of the chamber 104c are built of insulating material (like rigid plastic, metal coated with plastic, ceramic, nylon, PTFE etc.). These materials help prevent loss of heat from the chamber and help keep the temperature of the pumped fluid 104g high, thus improving pumping efficiency.

Figure 6A:
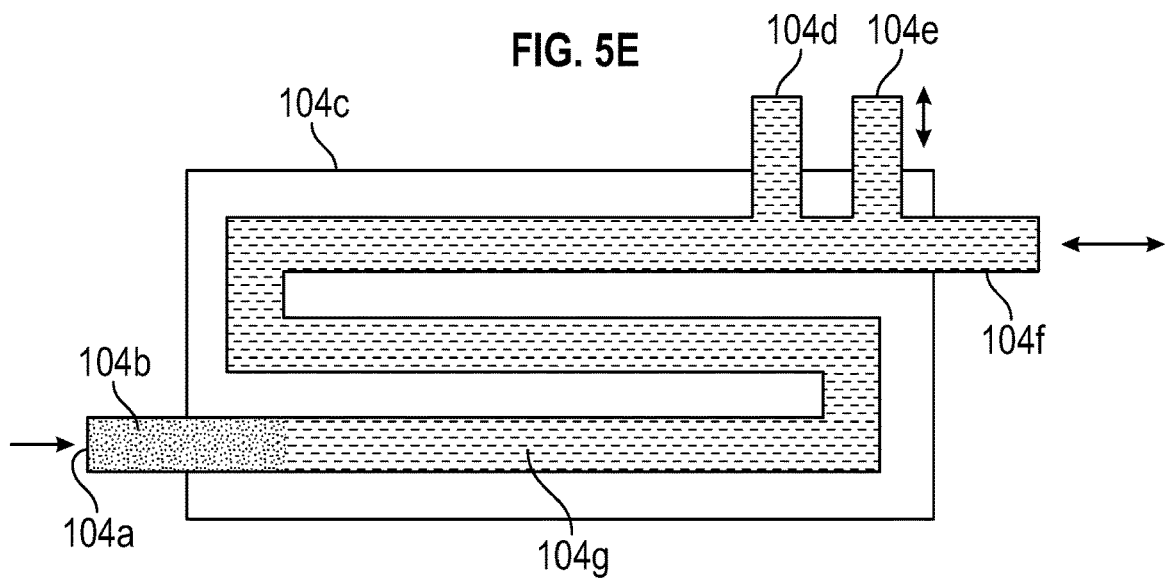
FIGS. 6A-6E are schematic plan views of five different piston/suction chamber embodiments for use in either of the HAMFOP embodiments of FIGS. 2 and 3.
Figure 6B:
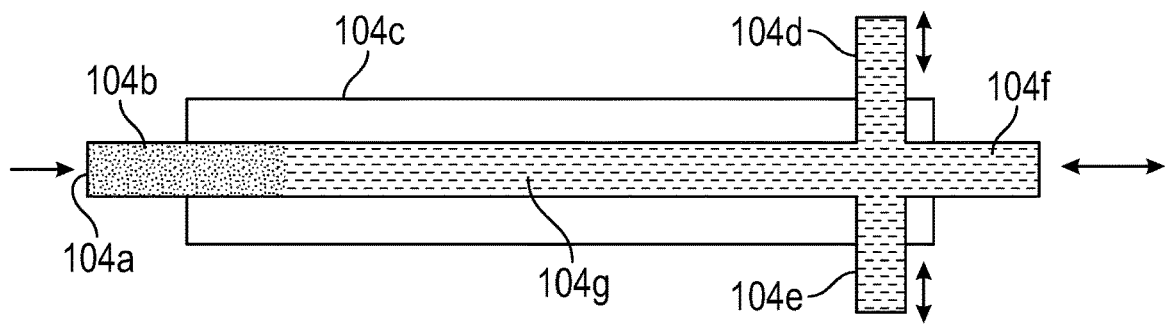

2) The cross-sectional area of the chamber 104c is kept relatively small, as compared to its length. This minimizes the actual surface area of the liquid 104g directly exposed to the vapor 104b. Thus, the loss of heat to the pumped fluid 104g is minimized while the fluid is being pushed out of the chamber 104c through exit port 104f by the vapor 104b. This achieves a longer pumping stroke. The overall volume of the piston chamber 104c needs to be sized to be the desired stroke per cycle of the pump. To keep the size compact, the chamber 104c can be curved or twisted in a serpentine passageway or channel, as illustrated in FIG. 6A. The shape of the cross-sectional area could be any geometry convenient for the application or manufacturing process (circular, rectangular etc.).

3) The inner surfaces of the chamber 104c may also be coated with a fluid-repelling material to reduce frictional losses as the fluid 104g is pumped out. The outer surface of the chamber 104c needs to be thermally insulated to minimize convective and radiant heat loss.

To speed up condensation of the vapor 104b, the far end of the chamber 104c may be connected to a perpendicular chamber 104d (FIG. 6B) leading back to the hot chamber for working fluid replenishment. Once the vapor 104b reaches that perpendicular chamber 104d, the volume almost doubles in size, resulting in rapid adiabatic expansion and faster condensation of the vapor 104b. Placing the perpendicular chamber 104d at the far end ensures maximum pumping stroke.

Figure 6C:
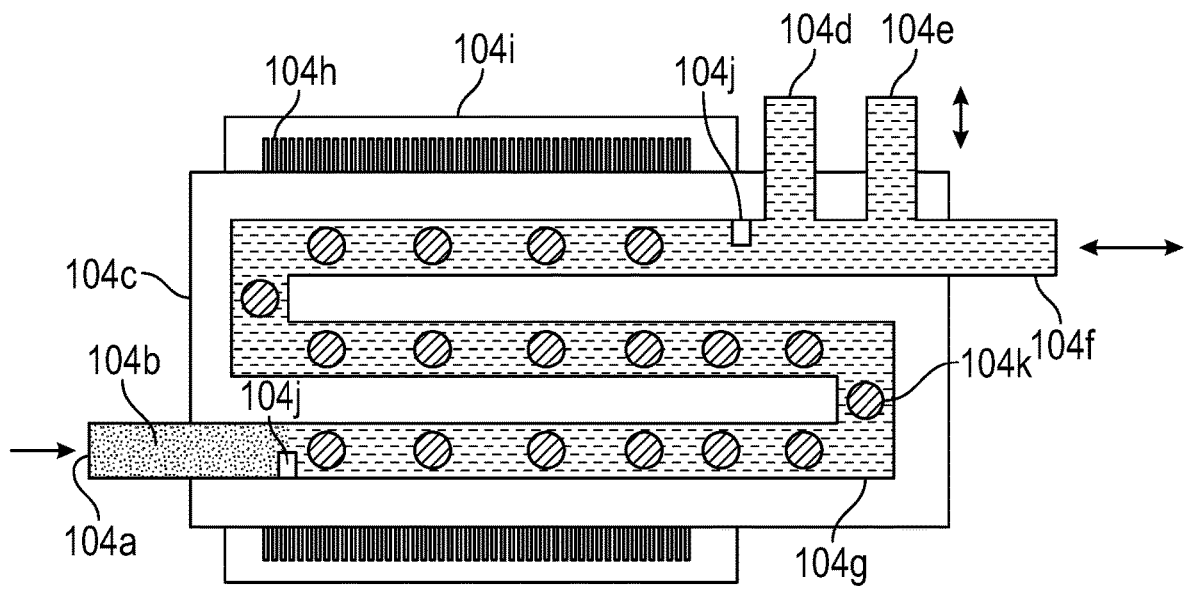
Figure 6D:
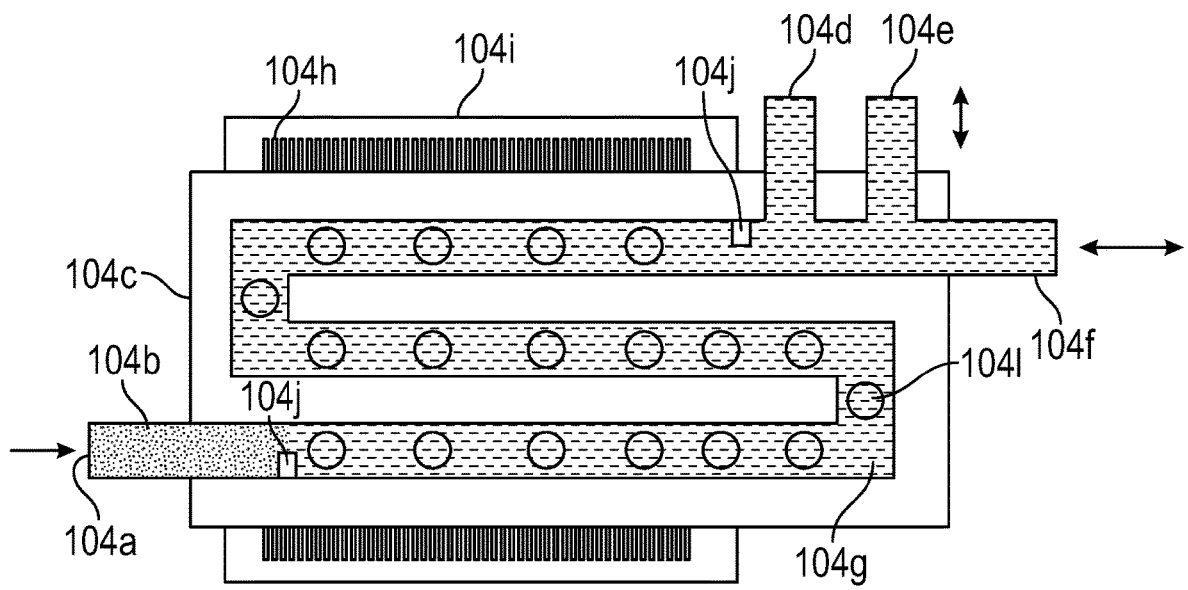
Figure 6E:
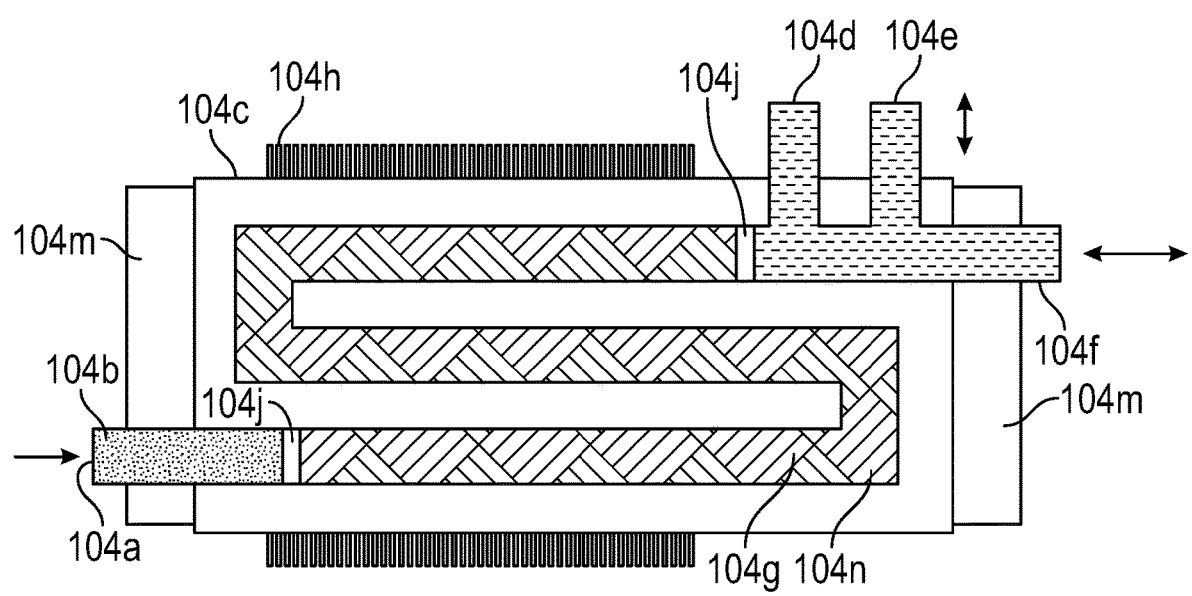

An electrical energy generation module design may be part of the piston/suction chamber (such as the embodiments shown in FIGS. 6C-6E). This optional module is designed to convert some of the useful done by the piston/suction chamber into electrical energy and will be discussed in more detail in a subsequent section.

4. Pump-Exit Check Valve 109

The pump-exit check valve is a unidirectional, minimal-cracking-pressure check valve that prevents pumped fluid from returning directly to the pump/suction chamber. The structure and geometry of this check valve can be implemented in a myriad of different ways. FIGS. 7A-7C illustrate three possible embodiments of a pump-exit check valve. In addition, commercially available check valves can also be used as part of this arrangement. Simplicity of design is partly what makes it a compelling solution in applications where cost, reliability and ease of assembly are imperative.

A valve actuator $109c$ and (when used) a valve spring $109e$ are contained within a valve housing $109d$. Pumped fluid $109g$ can, when the valve is open, enter the valve from the piston/suction chamber through fluid entry port or orifice $109a$ bounded by a sealing O-ring $109b$. A valve actuator $109c$ in the form of a ball pushes against the sealing O-ring $109b$ to close the valve. In the embodiments seen in FIGS. 7A and 7C, a valve spring $109e$ biases the ball actuator $109c$ against the O-ring seal $109b$. In the embodiment seen in FIG. 7B, gravity holds the ball actuator $109c$ against the O-ring seal $109b$. (This latter embodiment requires the valve to be oriented with the entry orifice $109a$ at the bottom.) Fluid exits the valve through the exit port $109f$ leading, in this instance, to a condenser 107 (seen in FIGS. 2 and 3). FIGS. 7A and 7C show that the exit port $109f$ can be in several possible locations relative to the ball actuator $109c$. In FIG. 7A it is beyond the ball valve actuator $109c$, while in FIG. 7C it is located on the entry side of the ball. The FIG. 7C has an advantage that the ball does not interfere with flow of the fluid $109g$ through the valve, even when the ball is nearly as large as the valve. The FIG. 7A embodiment may require a slightly smaller ball, and therefore somewhat orientation dependent to reseat properly when closing against the seal $109b$.

5. Suction Entry Check Valve 105

Figure 8A:
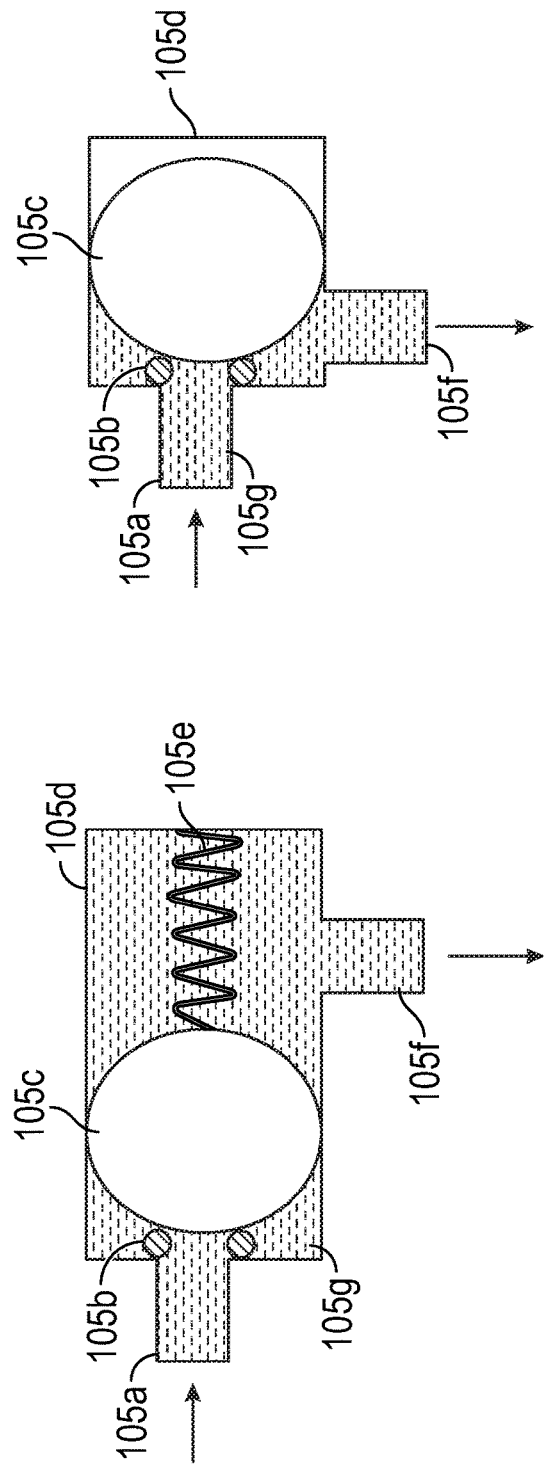
FIGS. 8A-8C are side schematic plan views of three different suction entry check valves for use in either of the HAMFOP embodiments of FIGS. 2 and 3.
Figure 8B:
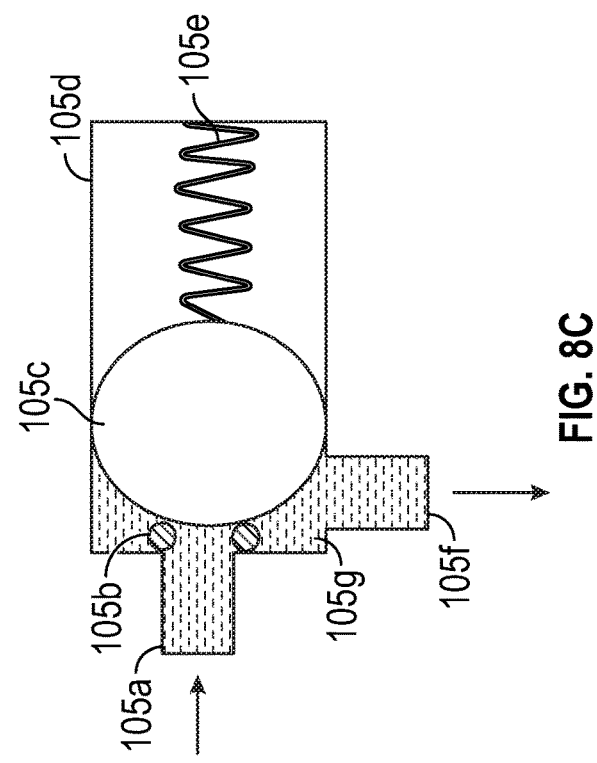
Figure 8C:
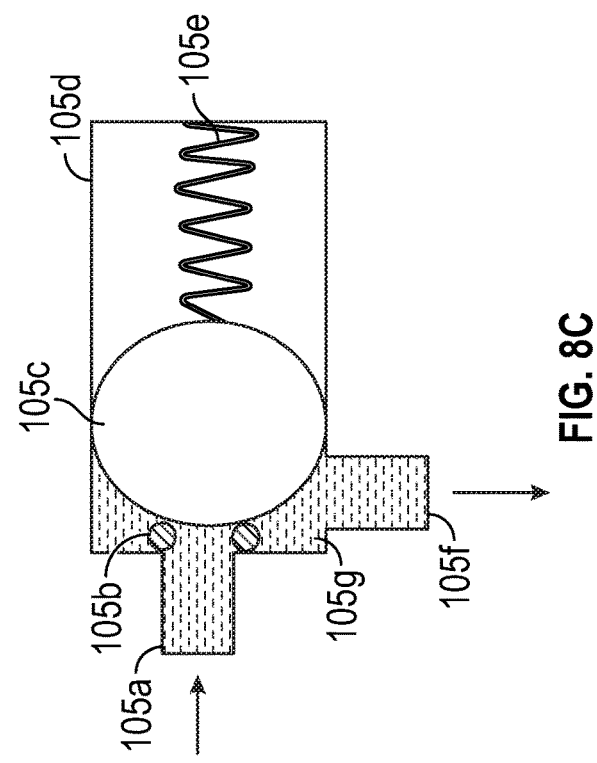

The suction check valve ensures that fluid enters the piston/suction chamber only when the pressure in the piston/suction chamber has dropped by a set pressure. This set pressure is typically below atmospheric pressure or whatever pressure the suction reservoir is set at. FIGS. 8A-8C illustrate three possible embodiments of a suction entry check valve. In addition, commercially available check valves can also be used as part of this arrangement. Again, simplicity of design is partly what makes it a compelling solution in applications where cost, reliability and ease of assembly are imperative.

The structure of the suction entry check valve may be identical to that of the pump-exit check valve, or a different embodiment, A, B, or C, may be chosen for each valve depending on orientation or other factors. A valve actuator $105c$ and (when used) a valve spring $105e$ are contained within a valve housing $105d$. Pumped fluid $105g$ can, when the valve is open, enter the valve from the condenser through fluid entry port or orifice $105a$ bounded by a sealing O-ring $105b$. A valve actuator $105c$ in the form of ball pushes against the sealing O-ring $105b$ to close the valve. In the embodiments seen in FIGS. 8A and 8C, a valve spring $105e$ biases the ball actuator $105c$ against the O-ring seal $105b$. In the embodiment seen in FIG. 8B, gravity holds the ball actuator $105c$ against the O-ring seal $105b$. (This latter embodiment requires the valve to be oriented with the entry orifice $105a$ at the bottom.) Fluid exits the valve through the exit port $105f$ leading, in this instance, to pump/suction chamber 104 (seen in FIGS. 2 and 3). FIGS. 8A and 8C show that the exit port $105f$ can be in several possible locations relative to the ball actuator $105c$. In FIG. 8A it is beyond the ball valve actuator $105c$, while in FIG. 8C it is located on the entry side of the ball. The FIG. 8C has an advantage that the ball does not interfere with flow of the fluid $105g$ through the valve, even when the ball is nearly as large as the valve. The FIG. 8A embodiment may require a slightly smaller ball, and therefore somewhat orientation dependent to reseat properly when closing against the seal $105b$.

6. Hot Chamber Return Valve 111

The hot chamber return or replenishment valve allows some of the working fluid in the hot chamber to return to the hot chamber for re-vaporization. This quantity of fluid is a relatively small quantity because the working fluid typically has significant latent heat of vaporization (a small volume of fluid can result in orders of magnitude higher volumetric vapor). The return valve is the first valve that fluid encounters along the piston/suction chamber, starting from the chamber's working fluid entry port. The principle of operation of the return valve is as follows: (1) When the vapor pushes the pumped fluid in the piston/suction chamber, a transient shock wave is produced, which temporarily raises the pressure of the pumped fluid to values higher than the vapor pressure in the hot chamber. Simultaneously, as the vapor is leaving the hot chamber, the pressure in the hot chamber drops to a lower value as well. (2) This increased pressure differential forces the return valve to open and transfer a small amount of the fluid $111g$ to flow into the hot chamber until the pressure across both becomes equal. (3) The valve then closes and prevents any reverse flow of fluid from the hot chamber to the piston/suction chamber.

The return valve needs to be designed such that it converts the high-pressure shock wave in the fluid into high-speed flow of fluid into the hot chamber. Depending on the amount of pressure differential needed, the return valve could be a simple non-return check valve (as in FIGS. 9A through 9C) or be more complex, designed to act like a nozzle or injector $111h$ that speeds up the flow of the fluid in a transient shock wave to speed up and pressurize the fluid flow into the hot chamber (as shown in FIG. 9D).

Figure 9A:
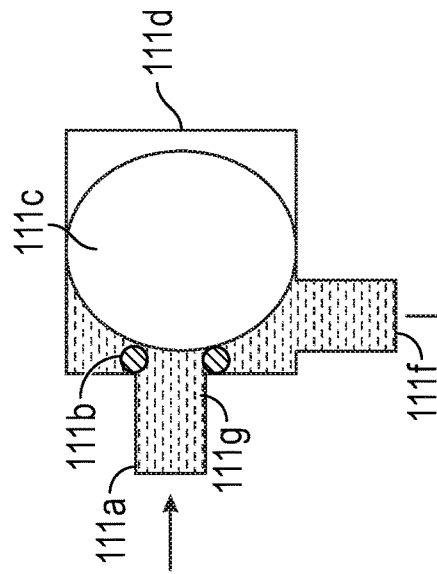
FIGS. 9A-9D are side schematic plan views of four different return/replenishment valve embodiments for use in either of the HAMFOP embodiments of FIGS. 2 and 3. The FIG. 9D embodiment provides an additional injector nozzle to speed up the flow of the working fluid back into the hot chamber.
Figure 9B:
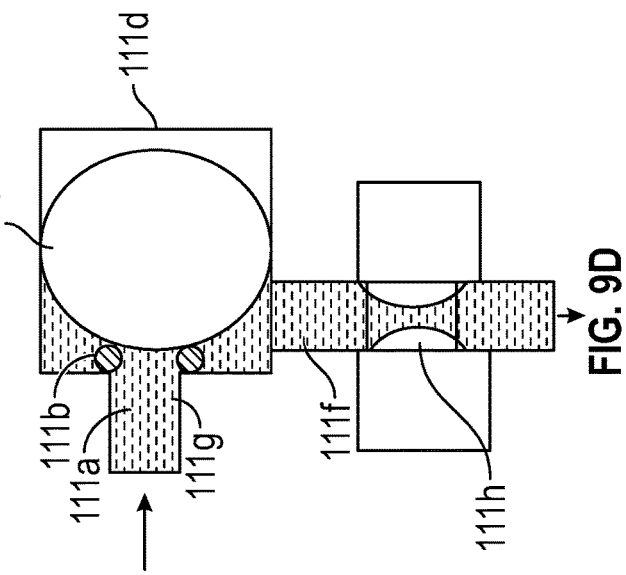
Figure 9C:
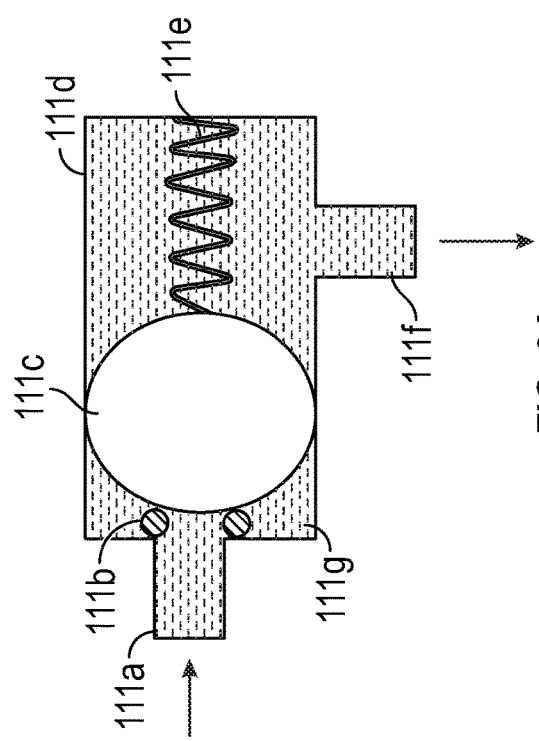

For the simpler check valve versions of FIGS. 9A-9C, the structure of the return valve may be identical to any of the pump-exit and suction entry check valves, or a different embodiment, A, B, or C, may be chosen for each valve depending on orientation or other factors. A valve actuator $111c$ and (when used) a valve spring $111e$ are contained within a valve housing $111d$. Working fluid $111g$ can, when the valve is open, enter the valve from the piston/suction chamber through fluid entry port or orifice $111a$ bounded by a sealing O-ring $111b$. A valve actuator $111c$ in the form of a ball pushes against the sealing O-ring $111b$ to close the valve. In the embodiments seen in FIGS. 9A and 9C, a valve spring $111e$ biases the ball actuator $111c$ against the O-ring seal $111b$. In the embodiment seen in FIG. 9B, gravity holds the ball actuator $111c$ against the O-ring seal $111b$. (This latter embodiment requires the valve to be oriented with the entry orifice $111a$ at the bottom.) Fluid exits the valve through the exit port $111f$ leading, in this instance, to hot chamber 101 (seen in FIGS. 2 and 3). FIGS. 9A and 9C show that the exit port $111f$ can be in several possible locations relative to the ball actuator $111c$. In FIG. 9A it is beyond the ball valve actuator $111c$, while in FIG. 9C it is located on the entry side of the ball. The FIG. 9C has an advantage that the ball does not interfere with flow of the fluid $111g$ through the valve, even when the ball is nearly as large as the valve. The FIG. 9A embodiment may require a slightly smaller ball, and therefore somewhat orientation dependent to reseat properly when closing against the O ring seal $111b$.

Figure 9D:
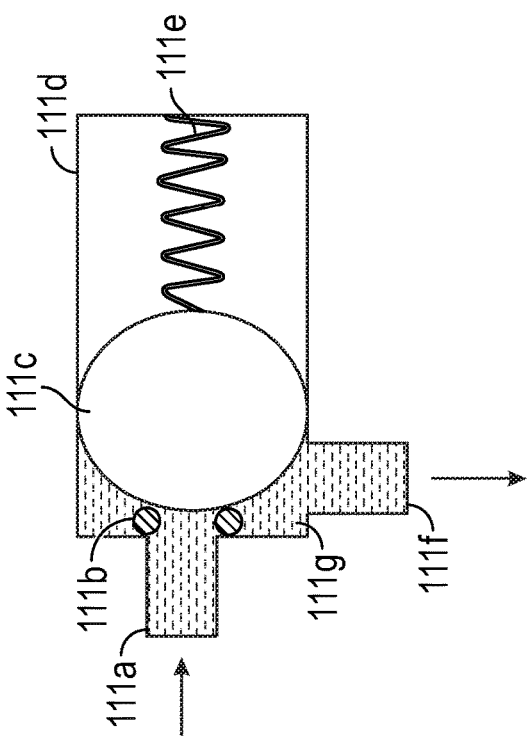

As seen in FIG. 9D, the front end of the valve is the same as that of a simple check valve (here based on the FIG. 9B version, but either of the other two simple check valves of FIG. 9A or 9C could also serve as the front end of the valve).

At the fluid exit 111f of the valve's front end, a flow enhancing nozzle 111h is added. The nozzle 111h as a restrictive or choked passageway to speed up the flow of the fluid 111g in response to a pressurized transient shock. This aids injection of a small amount of the working fluid 111g back into the hot chamber.

7. Working Fluid—Pumped Fluid Separator 113

If the working fluid and pumped fluid are not simply the same substance of different phases (liquid and vapor), but rather entirely different substances, then it is vital to keep pumped fluid from entering the hot chamber, which would interfere with correct operation of the pumping cycle. A difference in density of the two fluid materials can be leveraged to separate them to return only the working fluid back to the hot chamber. In the embodiment seen in FIGS. 10A-10C, the working fluid 113c is of a lower density than the pumped fluid 113d, so the pumped fluid 113d sinks to the bottom of the separator, while the less dense working fluid 113c floats to the top of the separator. The separator's entry port is labeled 113b. This receives both pumped fluid 113d and working fluid 113c (which can have condensed into a liquid) from the piston/suction chamber. The separator has two exit ports, a lower exit port 113h for the pumped fluid 113d, and an upper exit port 113a for return of the working fluid 113c to the hot chamber. Between the entry port 113b and the two exit ports 113h and 113a is a separator body 113f that includes a fluid reservoir 113e and 113g, where an upper reservoir portion 113e is for holding the working fluid 113c and a lower reservoir portion 113g is for the holding the pumped fluid 113d (albeit possibly with suspended immiscible droplets or bubbles 113i of working fluid rising toward the upper reservoir portion 113e through the pumped fluid 113d). In step 1 (FIG. 10A), the working fluid 113c has not quite expanded in the piston/suction chamber sufficiently to have reached the separator, so only pumped fluid 113d is received in the reservoir 113g. A small reserve of working fluid 113c from the previous cycle is retained in the upper reservoir portion 113e to isolate the pumped fluid 113d from the upper exit port 113a. In step 2 (FIG. 10B), working fluid 113c has expanded further, pushing even more pumped fluid 113d into the reservoir 113g. Excess pumped fluid 113d exits through the lower exit port 113h at the bottom of the reservoir 113g. In step 3 (FIG. 10C), expansion of the working fluid 113c is now sufficiently great that even droplets of working fluid 113c are entering the lower reservoir portion 113g. These droplets rise through the pumped fluid 113d to reach the upper reservoir portion 113e. Only working fluid 113c can exit the separator through the upper exit port 113a. The pumped fluid 113d always remains below the level of the upper exit port 113a.

8. Electrical Energy Generation Module

This optional module (in piston/suction chamber embodiments seen in FIGS. 6C-6E) is designed to convert some of the useful done by the piston/suction chamber 103c into electrical energy. Such a module would be particularly useful for instance in wearable devices, where harvesting the waste heat and converting it into electrical energy can help with performance and battery life.

The module is comprised of the following key elements:
1) A series of permanent magnets positioned inside the piston/suction chamber 104c as illustrated for example in FIGS. 6C-6E. The permanent magnets could have different embodiments depending on the application. In one embodiment, the magnets are small solid or hollow spherical balls 104k or 104l moving freely inside the piston/suction chamber 104c. In another embodiment where vertical space is a constraint, they are thin plates. In yet another embodiment, they are ferromagnetic or paramagnetic particles 104m suspended in the pumped fluid 104g. The functional intent of each embodiment is the same: permanent magnets that are placed inside the pumped fluid 104g and which move back and forth as the fluid 104g is pumped out and suctioned into the chamber 104c.
2) A winding coil 104h that is circumferentially wound around the piston/suction chamber 104c so that electrical voltage/current is induced in the coil 104h. There are electrical conduits in and out of the coil to extract the induced voltage/current. The winding coil 104h is usually made of copper or other high electrical conductivity material.
3) A back-iron 104i that encapsulates the piston/suction chamber 104c to help manage the magnetic field induced and the corresponding eddy currents.

The principle of operation of the module is as follows: (1) As the vapor 104b enters the piston/suction chamber 104c, it displaces the fluid 104g. The force imparted on the fluid 104g by the vapor 104b is also transmitted to the permanently magnetized balls, discs, plates, or particles 104k-104n, causing them to move. The magnets are permanently magnetized N-S. (2) As the magnets 104k-n move, current is induced in the winding coil 104h. (3) When the piston/suction chamber 104c is empty, fresh suction fluid 104g is pulled or suctioned in through the suction entry port 104e and this causes the magnets to move back towards the vapor entry point 104a, again inducing current in the winding coil 104h. This oscillatory movement generates current in the coil 104h, thus converting part of the fluid movement into useful electricity. This operation method is similar to that commonly used in standard linear generators. The performance of the module is enhanced with these features:
1) The magnets 104k-n in the fluid need to be free moving, introducing as little friction as possible as they move back and forth. To enhance this, the inner walls of the piston/suction chamber 104c can be coated with a smooth coating to reduce friction losses.
2) The inertia losses when moving large masses of magnets can be significant, which can impact the fluid pumping efficiency. The lighter the magnets, the lower the losses. Ferromagnetic particulate materials 104m of the order of a few nanometers or microns that are suspended in the pumped fluid 104g can reduce the inertia losses. However, in whatever form the magnets take, these ferromagnetic materials 104k-n cannot be allowed to leave the piston/suction chamber 104c through the pumped fluid exit port 104f. To prevent them from leaving the chamber 104c and still letting the pumped fluid 104g leave, mesh screens 104j are installed at the inlet and outlet sections 104a and 104f of the piston/suction chamber 104c.

What is claimed is:

1. A heat-activated multiphase fluid-operated pump, comprising:
a hot chamber containing a working fluid and receptive of externally applied heat to convert the working fluid into vapor;
a pressure-control safety valve coupled to an exit port of the hot chamber and maintaining the working fluid in the hot chamber at a set target pressure and allowing vaporized working fluid to escape through the exit port whenever the target pressure is exceeded;
a liquid-piston chamber coupled to the pressure-control safety valve to receive vaporized working fluid from the hot chamber at the target pressure, the vaporized working fluid expanding adiabatically and displacing liquid within the liquid-piston chamber, expelling it therefrom in a pumping stage of a thermodynamic cycle;
a unidirectional pump-exit check valve coupled to an exit port of the liquid-piston chamber to allow the displaced liquid to exit the liquid-piston chamber;
a unidirectional liquid suction-entry check valve coupled to a return port of the liquid-piston chamber;
a condenser coupled to the pump-exit and suction-entry check valves to receive displaced liquid and allow it to return to the liquid-piston chamber in a suction stage of the thermodynamic cycle; and
a unidirectional vapor-injector return check valve coupled to both an exit port of the liquid-piston chamber and to an input port of the hot chamber, wherein periodic pressure pulses from the liquid-piston chamber that temporarily exceed the pressure in the hot chamber facilitate jets of condensed fluid to return in successive brief spurts.

2. A heat-activated pump as in claim 1, wherein the pressure-control safety valve comprises a biasing mechanism applying a port-sealing force upon the exit port of the hot chamber preventing vapor from exiting the hot chamber before a specified pressure is reached.

3. A heat-activated pump as in claim 2, wherein the biasing mechanism is in the form of a dense load centered by grooves upon a load seat over the exit port of the hot chamber.

4. A heat-activated pump as in claim 2, wherein the biasing mechanism is in the form of a spring-loaded ball.

5. A heat-activated pump as in claim 1, wherein the pressure-control safety valve comprises a flexible material covering the exit port of the hot chamber and providing a degree of stiffness or springiness that allows vapor to exit the hot chamber only when pressure in the hot chamber exceeds a target load.

6. A pump as in claim 1, wherein the liquid in the liquid-piston chamber is a same material as the working fluid.

7. A pump as in claim 1, wherein the liquid in the liquid-piston chamber is a different immiscible material of different density from the working fluid, the pump further comprising a separator coupled between the liquid-piston chamber and the exit ports thereof to direct the working fluid to the vapor-injector return check valve leading back to the hot chamber and the displaced liquid to the pump-exit check valve leading to the condenser.

8. A pump as in claim 1, further comprising permanent magnetic material within the liquid in the liquid-piston chamber and an induction electrical generator surrounding the liquid-piston chamber.

9. A heat-activated pump as in claim 1, wherein each of the check valves comprises a passageway with a pair of spaced apart built-in obstructions holding a valve ball or disc therebetween, one of the pair of obstructions preventing fluid flow when abutted by the valve ball or disc and the other of the pair of obstructions allows fluid flow around that obstruction when abutted by the valve ball or disc.

10. A heat-activated pump as in claim 1, wherein the hot chamber and condenser are formed in separate portions of a common plate, the condenser comprising a cavity formed by a set of one or more channels in the plate, and the liquid-piston chamber comprising a set of one of more channels in the plate.

11. A heat-activated pump as in claim 1, wherein the hot chamber comprises a heat source thermally coupled to a chamber body with said exit port with the pressure-control safety valve and said input port with the unidirectional vapor-injector return check valve, the chamber body containing the working fluid and receptive of applied heat from the heat source.

12. A heat-activated pump as in claim 11, wherein the chamber body of the hot chamber includes a copper mesh to enhance heat conduction from enclosure walls of the chamber body into the working fluid.

13. A heat-activated pump as in claim 11, wherein the chamber body includes a high porosity metal foam filling, the high porosity metal foam enhancing heat conduction from walls of the heating channel into the working fluid.

14. A heat-activated pump as in claim 11, wherein the heat source is located within the chamber body.

15. A heat-activated pump as in claim 1, wherein the liquid-piston chamber comprises a serpentine channel containing incompressible liquid that is displaced by the adiabatically expanding vaporized working fluid.

16. A heat-activated pump as in claim 15, wherein the incompressible liquid has permanent magnetic material suspended therein between a pair of mesh screens in the serpentine channel with a winding coil surrounding the serpentine channel forming an induction electrical generator.

17. A heat-activated pump as in claim 1, wherein the pump-exit check valve, suction entry check valve, and unidirectional vapor-injector return check valve are ball valves with a valve spring biasing mechanism holding a ball valve actuator against an entry port until a target pressure is exceeded.

18. A heat-activated pump as in claim 17, wherein the unidirectional vapor-injector return check valve further includes flow-enhancing injector nozzle on an exit side of that check valve.

19. A method of operating a heat-activated multiphase fluid-operated pump, comprising:
applying external heat to a hot chamber convert a working fluid therein to vapor;
allowing, whenever a set target pressure in the hot chamber is exceeded, the vaporized working fluid to escape into a liquid-piston chamber through a pressure-control safety valve coupled to an exit port of the hot chamber, the vaporized working fluid expanding adiabatically and displacing liquid within the liquid-piston chamber to expel the liquid from the liquid-piston chamber through an exit port with a unidirectional pump-exit check valve in a pumping stage of a thermodynamic cycle;
returning jets of condensed fluid to the hot chamber through an input port coupled to a unidirectional vapor-injector return check valve in periodic pressure pulses from the liquid-piston chamber that temporarily exceed the pressure in the hot chamber;
receiving the displaced liquid from the liquid-piston chamber in a condenser coupled to the pump-exit check valve;
allowing condensed liquid in the condenser to return through a unidirectional liquid suction-entry check valve coupled to a return port of the liquid-piston chamber in suction stage of the thermodynamic cycle; and
repeating the foregoing steps in multiple pump cycles.

* * * * *